(12) United States Patent
Johnson

(10) Patent No.: US 9,612,370 B1
(45) Date of Patent: Apr. 4, 2017

(54) EUV LIGHT SOURCE WITH SPECTRAL PURITY FILTER AND POWER RECYCLING

(71) Applicant: Kenneth C. Johnson, Santa Clara, CA (US)

(72) Inventor: Kenneth C. Johnson, Santa Clara, CA (US)

(73) Assignee: Kenneth C. Johnson, Santa Clara, CA (US)

( * ) Notice: Subject to any disclaimer, the term of this patent is extended or adjusted under 35 U.S.C. 154(b) by 0 days.

(21) Appl. No.: 15/284,513

(22) Filed: Oct. 3, 2016

Related U.S. Application Data

(63) Continuation of application No. PCT/US2016/034172, filed on Jun. 24, 2016.

(60) Provisional application No. 62/265,992, filed on Dec. 11, 2015, provisional application No. 62/273,598, filed on Dec. 31, 2015, provisional application No.
(Continued)

(51) Int. Cl.
| | |
|---|---|
| *A61N 5/00* | (2006.01) |
| *G03B 27/32* | (2006.01) |
| *G03B 27/54* | (2006.01) |
| *G03B 27/72* | (2006.01) |
| *G02B 5/18* | (2006.01) |
| *H05G 2/00* | (2006.01) |

(Continued)

(52) U.S. Cl.
CPC ....... *G02B 5/1838* (2013.01); *G02B 19/0095* (2013.01); *G03F 7/70033* (2013.01); *G03F 7/70158* (2013.01); *G03F 7/70175* (2013.01); *H05G 2/008* (2013.01)

(58) Field of Classification Search
CPC ............. G03F 7/70008; G03F 7/70033; G03F 7/70058; G03F 7/70158; G03F 7/70175; G03F 7/7055; H05G 2/00–2/008
USPC ...... 250/492.1–492.3, 504 R; 355/67, 71, 77
See application file for complete search history.

(56) References Cited

U.S. PATENT DOCUMENTS

| | | |
|---|---|---|
| 4,941,731 A | 7/1990 | Macken |
| 6,187,211 B1 | 2/2001 | Smith |

(Continued)

FOREIGN PATENT DOCUMENTS

| | | |
|---|---|---|
| EP | 1650786 | 4/2006 |
| JP | 0540223 | 2/1993 |

(Continued)

OTHER PUBLICATIONS

PCT/US2016/034172, Kenneth Carlisle Johnson, "Notification Concerning the Filing of Amendments of the Claims," and Article 19 Amendment, dated Oct. 7, 2016, 11 pages.

(Continued)

*Primary Examiner* — Colin Kreutzer
(74) *Attorney, Agent, or Firm* — Kilpatrick Townsend & Stockton LLP

(57) ABSTRACT

A plasma-generated EUV light source uses an EUV-diffracting collection mirror to channel spectrally pure in-band radiation through an intermediate-focus aperture and through EUV illumination optics. Out-of-band radiation is either undiffracted by the collection mirror or is diffractively scattered away from the aperture. The undiffracted portion, plus plasma-emitted radiation that does not intercept the collection mirror, can be efficiently recycled back to the plasma via retroreflecting mirrors, cat's-eye reflectors, or corner-cube reflectors, to enhance generation of in-band EUV radiation by the plasma.

17 Claims, 10 Drawing Sheets

Related U.S. Application Data

62/275,243, filed on Jan. 6, 2016, provisional application No. 62/279,753, filed on Jan. 16, 2016, provisional application No. 62/281,478, filed on Jan. 21, 2016, provisional application No. 62/317,212, filed on Apr. 1, 2016.

(51) Int. Cl.
   *G02B 19/00* (2006.01)
   *G03F 7/20* (2006.01)

(56) References Cited

U.S. PATENT DOCUMENTS

| | | | |
|---|---|---|---|
| 6,469,827 B1 | 10/2002 | Sweatt | |
| 6,809,327 B2 | 10/2004 | Bristol | |
| 7,050,237 B2 | 5/2006 | Chapman | |
| 8,592,787 B2 | 11/2013 | Moriya | |
| 2004/0061079 A1* | 4/2004 | Thompson | H01J 65/044 250/492.22 |
| 2004/0079902 A1* | 4/2004 | Bristol | G03F 7/70033 250/504 R |
| 2012/0248342 A1 | 10/2012 | Moriya et al. | |
| 2013/0027681 A1 | 1/2013 | Mann et al. | |
| 2013/0207004 A1 | 8/2013 | Ceglio et al. | |

FOREIGN PATENT DOCUMENTS

| | | |
|---|---|---|
| JP | 06118379 | 4/1994 |
| WO | 2016131069 | 8/2016 |
| WO | 2016131069 | 10/2016 |

OTHER PUBLICATIONS

PCT/US2016/034172 , "International Search Report and Written Opinion", Aug. 23, 2016, 15 pages.

Bayraktar, Muharrem, et al. "Spectral purification and infrared light recycling in extreme ultraviolet lithography sources." *Optics express* 22.7 (2014): 8633-8639. Available at http://dx.doi.org/10.1364/OE.22.008633.

Chkhalo, Nikolay I., et al. "Free-standing spectral purity filters for extreme ultraviolet lithography." *Journal of Micro/Nanolithography, MEMS, and MOEMS* 11.2 (2012), 021115-1, 7 pages. Available at http://dx.doi.org/10.1117/1.JMM.11.2.021115.

Feigl, Torsten, et al. "Sub-aperture EUV collector with dual-wavelength spectral purity filter." *SPIE Advanced Lithography*. International Society for Optics and Photonics, 2015, vol. 9422, 94220E-1, 7 pages. Available at http://dx.doi.org/10.1117/12.2175666.

Hassanein, A., et al. "Analysis, simulation, and experimental studies of YAG and CO2 laser-produced plasma for EUV lithography sources." *SPIE Advanced Lithography*. International Society for Optics and Photonics, 2010, vol. 7636, 76360A-1, 7 pages. Available at http://dx.doi.org/10.1117/12.848222.

Hori, Tsukasa, et al. "100W EUV light-source key component technology update for HVM." *SPIE Advanced Lithography*. International Society for Optics and Photonics, 2016, vol. 9776, 977625-1, 9 pages. Available at http://dx.doi.org/10.1117/12.2217947.

Kierey, Holger, et al. "EUV spectral purity filter: optical and mechanical design, grating fabrication, and testing." *Optical Science and Technology, SPIE's 48th Annual Meeting*. International Society for Optics and Photonics, 2004, vol. 5193, 70-78. Available at http://dx.doi.org/10.1117/12.507741.

Kriese, Michael, et al. "Development of an EUVL collector with infrared radiation suppression." *SPIE Advanced Lithography*. International Society for Optics and Photonics, 2014, vol. 9048, 90483C-1, 11 pages. Available at http://dx.doi.org/10.1117/12.2049279.

Liddle, J. Alexander, et al. "Nanoscale topography control for the fabrication of advanced diffractive optics." *Journal of Vacuum Science & Technology B* 21.6 (2003): 2980-2984. Available at http://dx.doi.org/10.1116/1.1622938 (equivalent document is submitted).

Medvedev, V. V., et al. "Infrared antireflective filtering for extreme ultraviolet multilayer Bragg reflectors." *Optics letters* 37.7 (2012): 1169-1171. Available at http://dx.doi.org/10.1364/OL.37.001169.

Medvedev, V. V., et al. "Infrared diffractive filtering for extreme ultraviolet multilayer Bragg reflectors." *Optics express* 21.14 (2013): 16964-16974. Available at http://dx.doi.org/10.1364/OE.21.016964.

Migura, Sascha, et al. "Anamorphic high-NA EUV lithography optics." *31st European Mask and Lithography Conference*. International Society for Optics and Photonics, 2015, vol. 9661, 96610T-1, 9 pages. Available at http://dx.doi.org/10.1117/12.2196393.

Miyamoto, Kenro. "The phase Fresnel lens." *JOSA* 51.1 (1961): 17-20. Available at http://dx.doi.org/10.1364/JOSA.51.000017.

Park, Chang-Min, et al. "Prospects of DUV OoB suppression techniques in EUV lithography." *SPIE Advanced Lithography*. International Society for Optics and Photonics, 2014, vol. 9048, 90480S-1, 10 pages. Available at http://dx.doi.org/10.1117/12.2046132.

Purvis, Michael A., et al. "Advancements in predictive plasma formation modeling." *SPIE Advanced Lithography*. International Society for Optics and Photonics, 2016, vol. 9776, 97760K-1, 12 pages. Available at http://dx.doi.org/10.1117/12.2221991.

Rollinger, Bob, et al. "LPP light source for actinic HVM inspection applications." SPIE Advanced Lithography. International Society for Optics and Photonics, 2015, vol. 9422, 94222K-1, 11 pages. Available at http://dx.doi.org/10.1117/12.2085794.

Suzuki, Yukio, et al. "Free-standing subwavelength grid infrared cut filter of 90mm diameter for LPP EUV light source." *Sensors and Actuators A: Physical* 231 (2015): 59-64. Available at http //dx.doi.org/10.1016/j.sna.2014.07.006 (equivalent document is submitted).

Trost et al., "Structured Mo/Si multilayers for IR-suppression in laser-produced EUV light sources", Optics Express 20131118 Optical Society of American, vol. 21, No. 23, Nov. 18, 2013, pp. 27852-27864. Available at http://dx.doi.org/10.1364/OE.21.027852.

van den Boogaard, A. J. R., et al. "Optical element for full spectral purity from IR-generated EUV light sources." *SPIE Advanced Lithography*. International Society for Optics and Photonics, 2009, vol. 7271, 72713B-1, 6 pages. Available at http://dx.doi.org/10.1117/12.829011.

van den Boogaard, A. J. R., et al. "Wavelength separation from extreme ultraviolet mirrors using phaseshift reflection." *Optics letters* 37.2 (2012): 160-162. Available at http://dx.doi.org/10.1364/OL.37.000160.

Voronov, D. L., et al. "Enhancement of diffraction efficiency via higher-order operation of a multilayer blazed grating." *Optics letters* 39.11 (2014): 3157-3160. Available at http://dx.doi.org/10.1364/OL.39.003157.

* cited by examiner

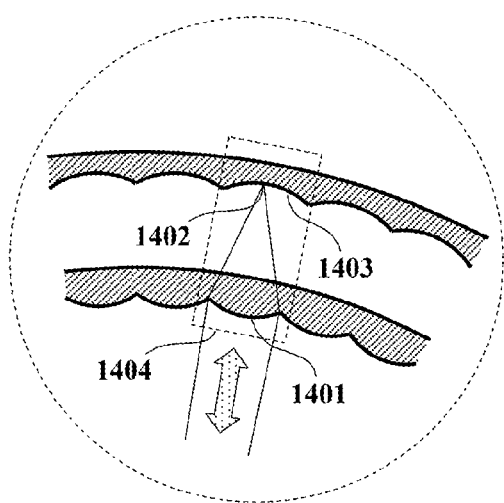
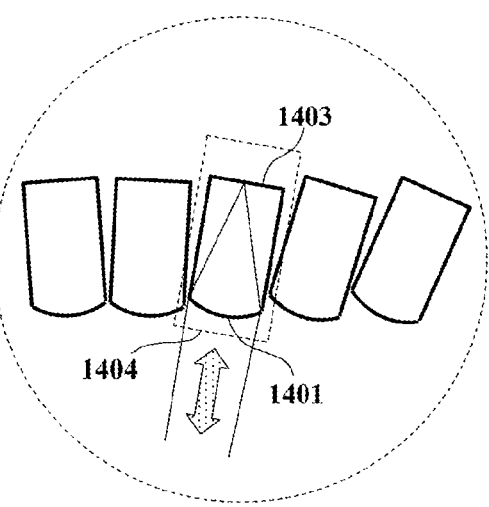
FIG. 14A  FIG. 14B
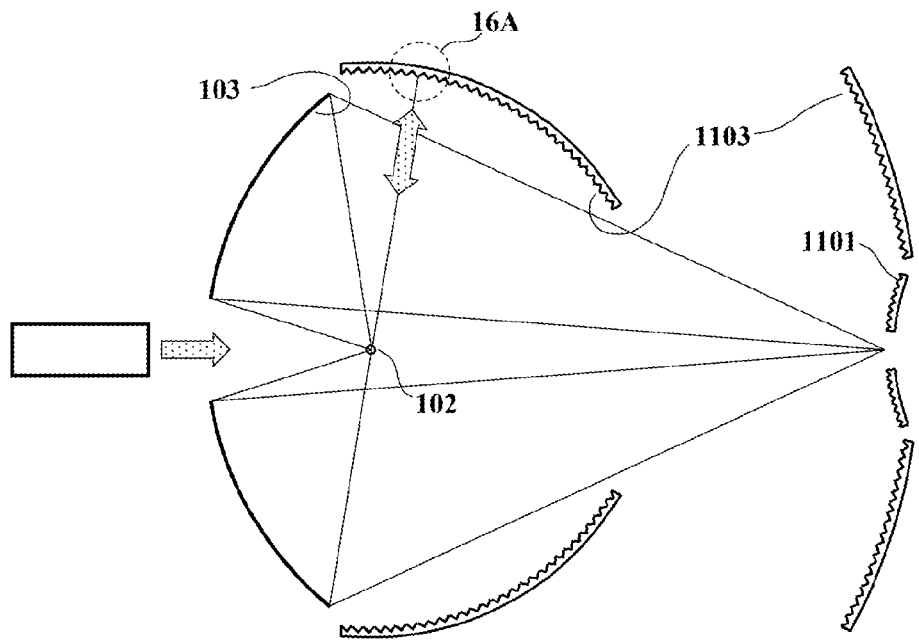
FIG. 15

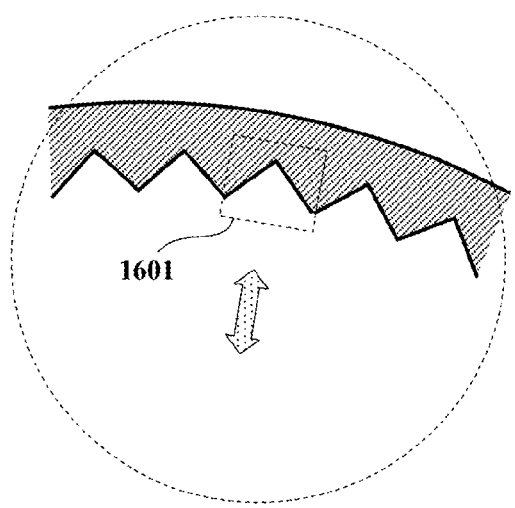
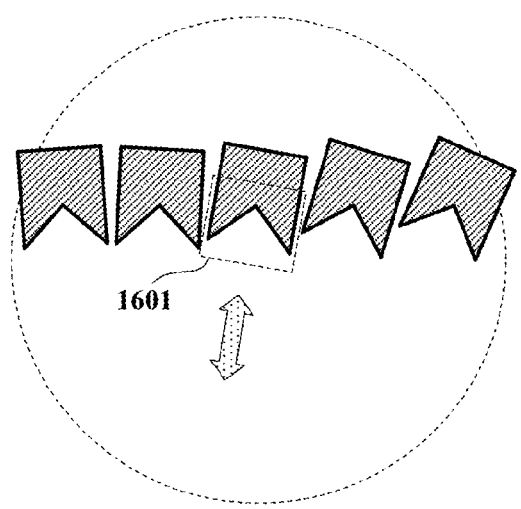
FIG. 16A　　　　　　　FIG. 16B
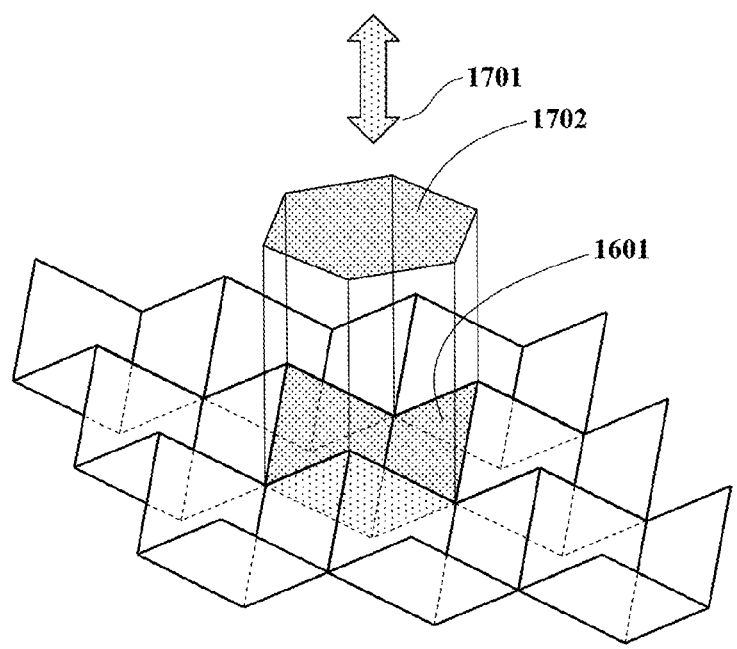
FIG. 17 (Prior Art)

EUV LIGHT SOURCE WITH SPECTRAL PURITY FILTER AND POWER RECYCLING

CROSS-REFERENCE TO RELATED APPLICATIONS

This application is a continuation application of PCT/US2016/034172, filed Jun. 24, 2016, entitled "EUV Light Source with Spectral Purity Filter and Power Recycling," which claims the benefit under 35 U.S.C. §119(e) of the following six applications:

- U.S. Provisional Patent Application No. 62/265,992, filed Dec. 11, 2015 for "EUV Spectral Purity Filter for Full IR-to-VUV Out-of-Band Rejection, with IR Power Recycling";
- U.S. Provisional Patent Application No. 62/273,598, filed Dec. 31, 2015 for "EUV Plasma Source with IR Power Recycling";
- U.S. Provisional Patent Application No. 62/275,243, filed Jan. 6, 2016 for "EUV Plasma Source with IR Power Recycling";
- U.S. Provisional Patent Application No. 62/279,753, filed Jan. 16, 2016 for "EUV Spectral Purity Filter for Full IR-to-VUV Out-of-Band Rejection, With IR Power Recycling";
- U.S. Provisional Patent Application No. 62/281,478, filed Jan. 21, 2016 for "EUV Spectral Purity Filter for Full IR-to-VUV Out-of-Band Rejection, With IR Power Recycling"; and
- U.S. Provisional Patent Application No. 62/317,212, filed Apr. 1, 2016 for "EUV Spectral Purity Filter for Full IR-to-VUV Out-of-Band Rejection, With IR Power Recycling."

The substance of these applications has been published in the following corresponding papers posted on the vixra.org e-print archive:

"EUV Spectral Purity Filter for Full IR-to-VUV Out-of-Band Rejection, with IR Power Recycling," http://vixra.org/abs/1512.0295:
  v1 (Dec. 12, 2015): corresponds to 62/265,992,
  v2 (Jan. 17, 2016): corresponds to 62/279,753, and
  v3 (Jan. 22, 2016) and v4 (Feb. 20, 2016): correspond to 62/281,478.

"EUV Plasma Source with IR Power Recycling", http://vixra.org/abs/1601.0001:
  v1 (Jan. 1, 2016): corresponds to 62/273,598, and
  v2 (Jan. 7, 2016): corresponds to 62/275,423

The entire disclosures of the above-referenced patent applications and papers are incorporated by reference for all purposes.

BACKGROUND OF THE INVENTION

This application pertains to generation of radiation, especially extreme ultraviolet (EUV) radiation, from a laser-produced plasma (LPP), for the purpose of illuminating a reflective photomask in a lithography or mask inspection process. The application relates specifically to spectral purity filtering (eliminating unwanted out-of-band radiation wavelengths in the illumination) and power recycling (returning some of the out-of-band radiation to the plasma to enhance generation of usable, in-band radiation).

Current-generation EUV lithography systems use an LPP illumination source, which generates EUV radiation from laser-irradiated tin droplets. In this process a high-power, $CO_2$ laser pulse (at a 10.6-μm wavelength) heats a small, molten tin target to form an ionized plasma, which generates EUV radiation from decay of tin ions to their neutral state. The optimum target size is much smaller than the diffraction-limited laser beam, so the target is typically first vaporized by a shorter-wavelength (e.g., 1-μm) pre-pulse laser to expand its size before it is irradiated and ionized by the main $CO_2$ laser pulse. [Hori et al.]

LPP sources are also useful for EUV inspection and metrology, which do not need as much power as lithography, but which require a very small, high-brightness plasma source. For these applications, a relatively short-wavelength laser (e.g., 1-μm) can be used to ionize the target without pre-pulse irradiation. [Rollinger et al.]

FIG. 1 illustrates the primary components of a prior-art EUV lithography system. [Hori et al.; Migura et al.] The LPP source 101 comprises apparatus for generating the ionized plasma 102 (including the drive laser, pre-pulse laser, and tin droplet generator—not shown), and a collection mirror 103. The collection mirror focuses plasma-generated EUV radiation to an intermediate focus (IF) 104, where it is spatially filtered by an intermediate-focus aperture (IF aperture) 105. The aperture-transmitted radiation is conveyed by illumination optics 106 to a reflective photomask 107 at object plane 108. The illumination optics control characteristics of the illumination such as its spatial profile on the photomask, the illumination's numerical aperture, and the coherence factor. The EUV-illuminated photomask is imaged by projection optics 109, at reduced magnification, onto a semiconductor wafer 110 in image plane 111. The illumination optics typically expand the illumination to a ring field on the photomask, and the photomask and wafer are mechanically scanned in tandem to effect full-field exposure.

An EUV inspection or metrology system could be similar to the lithography system of FIG. 1, but it would not need a pre-pulse laser and the wafer would be replaced by an image sensor.

The collection mirror uses a multilayer reflective coating, typically comprising about 40 or more Mo/Si bilayers of approximate thickness 7 nm per bilayer, to reflect plasma-generated radiation. The collection mirror reflects useful "in-band" EUV within a 2% wavelength band centered at 13.5 nm. (The band is limited by the multiple EUV reflections between the plasma and the image plane.) But the mirror also reflects a large amount of plasma-generated "out-of-band" radiation from the deep ultraviolet (DUV) to long-wave infrared (IR), which can be detrimental to lithography processes. [Park et al.] A variety of prior-art techniques have been developed or proposed for reducing the undesired out-of-band radiation in the LPP source output.

Current-generation LPP sources reject the IR via diffractive scattering from a surface-relief grating on the collection mirror, as illustrated in FIGS. 2 and 3. [van den Boogaard et al. (2012); Medvedev et al. (2013); Trost et al.; Kriese et al.; Feigl et al.] A $CO_2$ laser 201 irradiates the plasma 102 with IR radiation 202 (10.6-μm wavelength), and the plasma emits in-band EUV radiation 203 and out-of-band radiation including the 10.6-μm laser wavelength 204. A lamellar (rectangular-profile) diffraction grating on the collection mirror 103 separates the IR 205 from the EUV 206 in the reflected radiation.

An enlarged view of the mirror surface, illustrating the grating 301, is shown in FIG. 3. The grating comprises annular grooves, shown in cross-section. (The grating is axially symmetric around an optical axis through the plasma 102 and IF 104.) The grating is configured to extinguish zero-order (i.e., undiffracted) IR radiation at the 10.6-μm drive-laser wavelength, scattering the reflected IR into first (±1) and higher diffraction orders.

FIGS. 2 and 3 illustrate a light cone 207 converging from the plasma to a particular mirror point 208. The grating structure near this point diffracts 10.6-μm IR into ±1-order diffracted beams with light cones 209 and 210. The grating period Λ is too long to significantly affect the EUV (13.5-nm) radiation, which is substantially undeviated from the zero order beam, indicated as light cone 211. The collection mirror has an ellipsoidal substrate shape with foci at the plasma 102 and the IF 104 so that zero-order reflected EUV radiation is focused toward the IF and through the IF aperture 105. The IR is diffractively scattered out of the IF aperture.

For near-normal incidence the zero-order IR is extinguished by making the grating height h (FIG. 3) approximately one-quarter of the wavelength (i.e., 2.65 μm to achieve zero-order extinction of the 10.6-μm laser wavelength). The angular deviation θ between the zero and first diffraction orders is roughly equal to the wavelength-to-period ratio (at the laser wavelength); e.g., for a typical grating period of 1 mm the IR laser wavelength is diffractively deviated by approximately (10.6 μm)/(1 mm), or 10 mrad. By comparison, the plasma source's subtend angle δ at the grating is typically of order 1 mrad (e.g., for a 200-μm plasma diameter and a 200-mm collection mirror focal length). All of the light cones 207, 209, 210, and 211 have roughly 1 mrad extent, so the 10-mrad IR scatter angle θ is more than sufficient to separate the first-order IR and zero-order EUV beams.

The grating also induces some diffractive scatter in the EUV, but the scatter angle is only of order (13.5 nm)/(1 mm), i.e., 13.5 μrad, which is insignificant in comparison to the plasma's 1-mrad angular extent.

A limitation of these types of systems is that they are generally designed to only extinguish the zero order at only one wavelength (10.6 μm), so they do not achieve full rejection of all out-of-band radiation. Feigl et al. describe a two-level grating structure that rejects two wavelengths (the drive laser's 10.6-μm wavelength and the pre-pulse laser's 1.06-μm wavelength). But it does not fully exclude other wavelengths, including the DUV spectrum.

The grating 301 typically has the form illustrated in FIG. 4A. A lamellar, surface-relief structure is patterned in a substrate 401, and a multilayer reflective film 402 is then deposited on the grating structure. But van den Boogaard et al. (2012) use a different approach, as illustrated in FIG. 4B: The multilayer reflective coating is deposited on a smooth substrate, which does not have a grating topography, and the lamellar grating structure is patterned directly in the multilayer film.

Moriya et al. (U.S. Pat. No. 8,592,787) similarly disclose a spectral-filter grating structure patterned in a multilayer film on a smooth substrate, but the structure is non-lamellar. For example, the illustrated "Embodiment 1" grating in FIG. 3 of Moriya et al., shown as FIG. 4C herein, comprises a blazed, sawtooth profile, which diffracts the drive-laser (10.6-μm) radiation out of the IF aperture. The grating operates functionally as illustrated in FIG. 2, although its structure differs from the lamellar grating illustrated in FIG. 3. The reflected in-band EUV is concentrated in or near the zero order, which intercepts the IF aperture, and the out-of-band radiation is diffractively diverted out of the IF aperture. (See Moriya et al. at 13:16-14:6 and 14:57-63.)

A drawback of the Moriya et al. design is that it requires many layers in the reflective film. For example, the exemplary "Embodiment 1" has 300 bilayers including an unpatterned, 50-bilayer base structure and a patterned, 250-bilayer grating structure. (See Moriya et al. at 11:44-61 and 13:4-10) A conventional multilayer reflective film can achieve high EUV efficiency with only approximately 50 bilayers, but Moriya et al. note (at 12:8-12) that "If the number of pair layers is less than 100, then . . . it is not possible sufficiently to separate the EUV radiation from the radiation of other wavelengths."

The Embodiment 1 structure of Moriya et al. is specified as having 250 patterned bilayers with a bilayer thickness of 6.9 nm, implying a grating height of 1.7 μm. This is only about 16% of the 10.6-μm laser wavelength, but the height would actually need to be approximately 5.3 μm (one-half wavelength) to achieve first-order blazing and zero-order extinction at the laser wavelength. This would require approximately 768 patterned bilayers. With 250 patterned bilayers only a minor portion of the 10.6-μm IR would be diverted out of the IF aperture.

Moriya et al. cite prior-art proposals for spectral filters that use a blazed diffraction grating to separate the EUV from out-of-band radiation by diffracting the in-band EUV, rather than IR. [Chapman (U.S. Pat. No. 7,050,237); Bristol (U.S. Pat. No. 6,809,327); Kierey et al.; Sweatt et al. (U.S. Pat. No. 6,469,827)]

Chapman discloses an EUV-diffracting grating formed by cutting a thick, multilayer EUV-reflection coating at an inclined angle. A disadvantage of this type of grating is that it requires a very large number of Mo/Si bilayers ("at least two thousand" as recited in Chapman's claim 1).

Bristol and Kierey et al. disclose an EUV-diffracting grating disposed in a converging beam to separate the EUV from out-of-band radiation on a focal plane. Two disadvantages of this type of system are that it requires a separate optical element for spectral filtering, and the additional element significantly reduces EUV throughput.

Sweatt et al. disclose an alternative spectral filtering method that also uses a blazed diffraction grating to diffract the EUV and separate the EUV from out-of-band radiation. In some embodiments the grating is a near-normal-incidence reflective element, but the grating fabrication process differs from that of Moriya et al. Sweatt et al. note that "the blazed grating is preferably constructed on a substrate before a reflective multilayer, e.g., alternating Si and Mo layers, is deposited over the grating." Gratings of this type are described in Voronov et al. FIG. 5 illustrates the grating structure in cross section. A surface-relief structure having a blazed, sawtooth profile is patterned in a substrate 501, and a multilayer reflective film 502 is then deposited on the structure.

The condenser mirror disclosed by Sweatt et al. does not focus the EUV radiation through an intermediate focus and illumination optics as in FIG. 1. Instead, it focuses the plasma source onto a ring image, which is projected directly onto the photomask. The system has limited practical utility because it lacks the illumination control capabilities of the illumination optics 106 in FIG. 1. Also, the system uses a filtering aperture in close proximity to the photomask (element 124 in FIG. 8 of Sweatt et al.), which could create problems with heat dissipation, optical back-scatter of out-of-band radiation, and mechanical clearance (e.g., interference with a photomask pellicle and wafer loading mechanics). These limitations do not exist with the prior art represented in FIG. 1. Chapman describes other limitations of the Sweatt et al. system, as understood in the prior art. (See Chapman at 2:25-43.)

Blazed EUV reflection gratings operating at near-normal incidence have been researched by Liddle et al. and by van den Boogaard et al. (2009), although it is unclear from these publications how such gratings might be incorporated into an LPP collector for spectral filtering.

Other spectral filtering methods that do not use grating diffraction have also been proposed. Chkhalo et al. and Suzuki et al. disclose free-standing transmission films that transmit EUV and reflect IR, but the fragility of the film and its EUV transmission loss make such films impractical. The collection mirror's multilayer reflective film can be designed to reflect EUV and suppress IR. [Medvedev et al. (2012)] This avoids the need for a separate, fragile transmission film, but the EUV reflection efficiency is significantly compromised.

In most prior-art spectral filtering systems the rejected out-of-band radiation is eliminated as waste heat. But Bayraktar et al. disclose an IR-diffracting grating that is similar to FIG. 2, except that one of the first diffraction orders at 10.6 µm is directed back onto the plasma to enhance generation of in-band EUV radiation by the plasma. This "power recycling" capability could help boost EUV in-band power at intermediate focus to 250 W, the industry target level at which EUV lithography can become commercially viable for high-volume semiconductor manufacture. (Current state-of-the-art LPP sources achieve about 100 W.) But the Bayraktar et al. power recycling method has several practical limitations: It is only able to recycle out-of-band radiation at one wavelength (the 10.6-µm drive-laser wavelength); it can only recycle radiation that intercepts the collection mirror; and the grating's diffraction efficiency at 10.6 µm is only about 37%.

SUMMARY OF THE INVENTION

Embodiments of the present invention comprise elements of the LPP source 101 illustrated in FIGS. 1-3 (with some modifications of and additions to the prior art), including apparatus for generating an ionized plasma 102, a collection mirror 103, and an intermediate-focus (IF) aperture 105, which transmits plasma-generated radiation. For applications such as EUV lithography, the IF aperture may be disposed between the collection mirror and illumination optics 106, which convey the radiation to a reflective photomask 107 at an object surface 108. The photomask may be imaged by projection optics 109 onto a semiconductor wafer 110 at image plane 111.

The plasma generates in-band radiation comprising a range of emission wavelengths and out-of-band radiation comprising wavelengths greater than the in-band wavelengths. The invention operates in various embodiments to spectrally filter the EUV illumination (i.e., exclude out-of-band radiation from the IF aperture), or to recycle power (i.e., return some out-of-band radiation to the plasma), or to perform both functions.

In the spectral filtering embodiments, the collection mirror comprises a reflective diffraction grating, which diffractively reflects collected in-band radiation toward and through the IF aperture, while undiffracted, zero-order radiation is reflectively directed outside of the IF aperture. Out-of-band radiation is either not collected by the collection mirror, or is undiffracted by the grating, or is diffractively scattered outside of the intermediate-focus aperture, and in each case is thereby excluded from the intermediate-focus aperture.

In some power-recycling embodiments, out-of-band radiation that has been directed out of the IF aperture by the collection mirror is intercepted by reflective, power-recycling elements, which reflect the out-of-band radiation back to the collection mirror and onto the plasma to enhance generation of in-band radiation by the plasma. Plasma-emitted radiation that has not been collected by the collection mirror can also be returned to the plasma via reflective, power-recycling elements. In a variation of these methods, the power-recycling elements reflect the plasma radiation through an intermediate plasma image (a "relay image") and then back onto the plasma to form a non-inverted plasma self-image. (A non-inverted image will tend to track any positional variation of the plasma.)

The reflective, power-recycling elements may comprise one or more retroreflective mirrors. Alternatively, the power-recycling elements may comprise cat's-eye reflectors or corner-cube reflectors. Variant reflector types can be used in combination.

In some spectral-filtering embodiments (for EUV lithography), the in-band radiation comprises EUV radiation within a wavelength band including 13.5 nm, the diffraction grating operates in an m-th diffraction order for some non-zero integer m, and the out-of-band radiation comprises at least wavelengths greater than 2|m| times 13.5 nm.

The diffraction grating can be constructed as a substrate having a phase-Fresnel surface-relief structure, and a multilayer, reflective film stack deposited conformally on the phase-Fresnel structure. This type of grating will be termed "conformal-multilayer". Alternatively, the grating can be constructed as a smooth substrate on which a multilayer, reflective film stack is deposited, with a phase-Fresnel surface-relief structure patterned in the film stack. This type of grating will be termed "patterned-multilayer". In either case, the grating is blazed for optimal diffraction efficiency of the in-band wavelengths, and the grating has a sufficiently short period to achieve separation of the diffracted in-band radiation and undiffracted out-of-band radiation at the IF aperture.

A patterned-multilayer grating could have advantages over alternative grating types for spectral filtering. An EUV-diffracting, patterned-multilayer grating would be much simpler than the IR-diffracting grating disclosed by Moriya et al. Typically, fewer than 30 patterned Mo/Si bilayers (not hundreds) would be needed for EUV blazing. A patterned-multilayer grating might also be more manufacturable than a conformal-multilayer grating because patterning imperfections would only affect the top surface (whereas patterning errors in the FIG. 5 structure would affect the entire multilayer stack).

The spectral-filtering embodiments use a diffraction grating to separate in-band and out-of-band radiation by a different mechanism than that of the prior-art grating 301 in FIG. 3. Rather than diffracting IR out of the IF aperture, as in FIG. 2, the grating operates to diffract EUV into the aperture. (The mirror is designed to direct undiffracted, zero-order radiation out of the IF aperture, and the grating selectively diverts in-band EUV radiation toward the IF.) Some out-of-band radiation may be diffracted by the grating, but such radiation would still be directed out of the IF aperture because of the grating's chromatic dispersion. Thus, the grating is capable of filtering out all or most of the out-of-band radiation above a particular cutoff wavelength (e.g., 27 nm in some embodiments).

The power-recycling method has advantages relative to the prior art of Bayraktar et al. Power recycling via zero-order retroreflection is not limited to recycling only the 10.6-µm drive-laser wavelength, and is not limited to 37% diffraction efficiency. Moreover, much greater power-recycling efficiency can be achieved by recycling radiation that does not intercept the collection mirror.

A further understanding of the nature and advantages of the present invention may be realized by reference to the remaining portions of the specification and the drawings, which are intended to be exemplary and not limiting.

BRIEF DESCRIPTION OF THE DRAWINGS

FIGS. 13, 14A, and 14B illustrate power recycling using cat's-eye retroreflector elements.

FIGS. 15-18 illustrate power recycling using corner-cube retroreflector elements.

The drawings use three- or four-digit reference numerals in which the first one or two digits generally indicate the figure in which an element first appears. Identical or equivalent elements in different drawings are usually identified by the same reference numeral.

DESCRIPTION OF SPECIFIC EMBODIMENTS

Spectral Filtering

Figure 2:
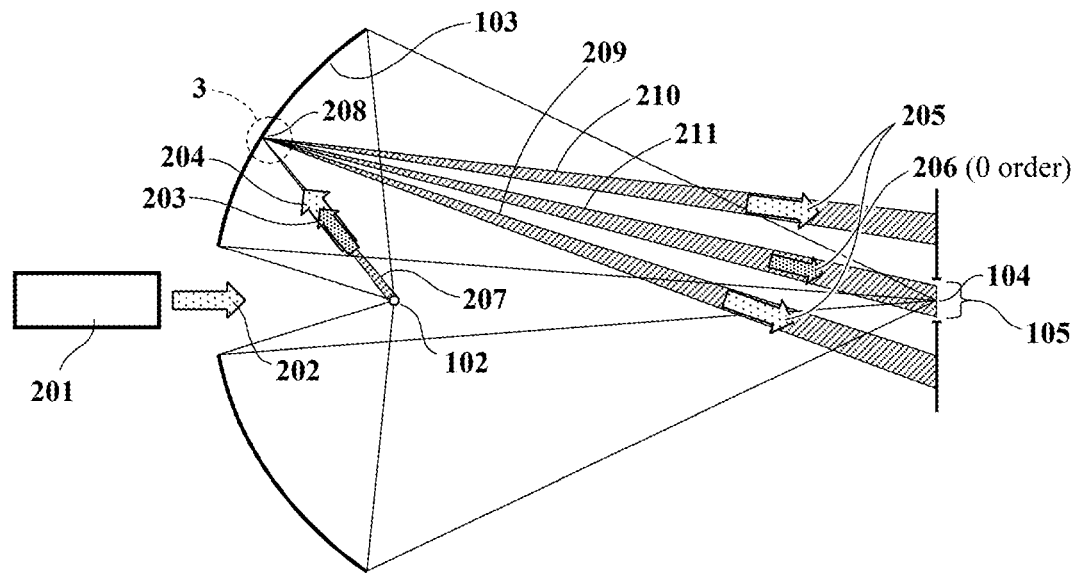
FIGS. 2 and 3 illustrate a prior-art LPP source for an EUV lithography system.
Figure 6:
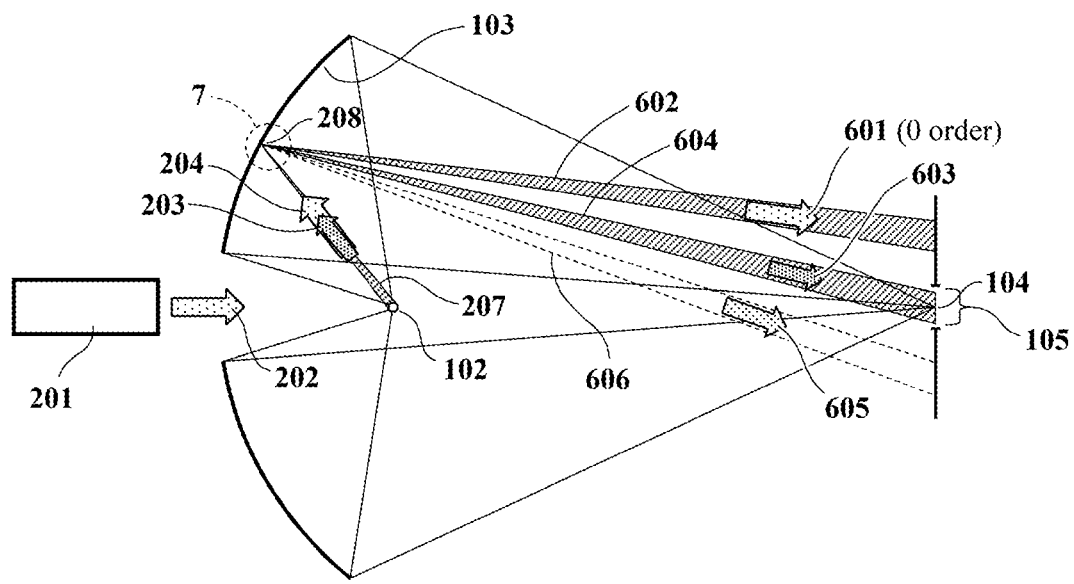
FIGS. 6 and 7 illustrate an LPP source that achieves full rejection of out-of-band radiation.
Figure 7:
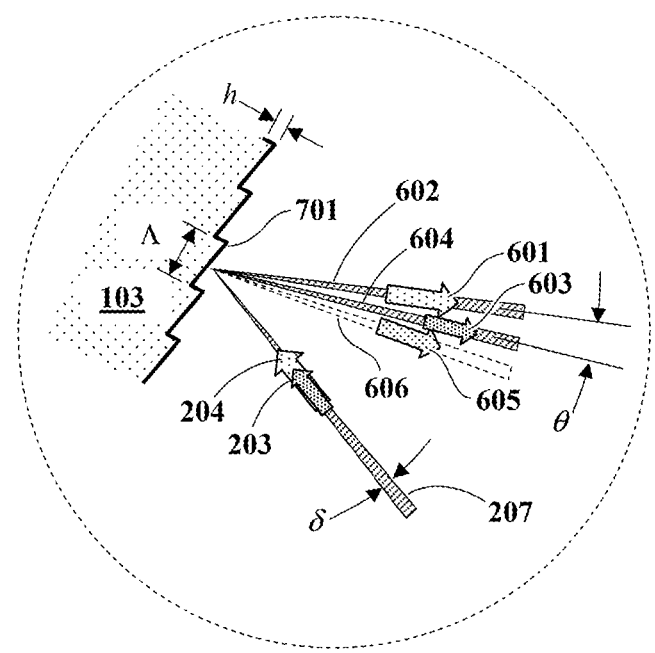

FIG. 6 and the enlarged view in FIG. 7 illustrate the spectral filtering function. A diffraction grating 701 on the collection mirror 103 is used to separate in-band and out-of-band radiation. The mirror does not focus undiffracted (zero-order) radiation from the plasma onto the IF 104 as in the prior-art system of FIG. 2; instead the zero-order reflection is directed outside of the IF aperture 105. The grating is not constructed primarily to diffractively scatter IR radiation out of the IF aperture; it is rather designed to efficiently diffract in-band EUV radiation into the aperture.

Some out-of-band radiation may be diffractively scattered by the grating, but the spectral filtering mechanism eliminates out-of-band radiation whether or not it is diffracted. The mechanism's operational principle is based on the grating's chromatic dispersion; it does not rely on zero-order extinction.

In the FIG. 6 embodiment, the mirror and grating are axially symmetric about an optical axis through the plasma 102 and IF 104, and the mirror is designed to reflect zero-order radiation into a ring or halo surrounding the IF aperture 105 so that such radiation is excluded from the aperture. (There is no spectral dispersion in the zero order, so zero-order exclusion operates at all wavelengths.) The grating 701 (FIG. 7) is constructed to concentrate a particular in-band EUV wavelength (the "blaze" wavelength, e.g., 13.5 nm) into a particular (non-zero) diffraction order and to direct the diffracted in-band radiation toward the IF and through the IF aperture. Some minor diffraction of EUV into other orders may be inevitable, but will not be significant if the grating is designed for maximum diffraction efficiency in the primary order. The grating would typically have a blazed, sawtooth profile, with period $\Lambda$ and height h, as illustrated in FIG. 7.

FIG. 6 illustrates the drive laser 201, laser-generated IR radiation 202, the plasma 102, plasma-emitted in-band EUV radiation 203 and out-of-band IR radiation 204, and a light cone 207 converging from the plasma to a particular mirror point 208. Much of the out-of-band radiation is reflected into a zero-order beam 601 with light cone 602 from point 208, while reflected in-band EUV 603 is efficiently diffracted into light cone 604, which is directed into the IF aperture 105. The light cones in FIGS. 6 and 7 all have cone angles approximately equal to the plasma subtend angle $\delta$ of the plasma at point 208 on the collection mirror.

The angular deviation $\theta$ between the zero-order and diffracted beams (FIG. 7) is roughly proportional to the wavelength-to-period ratio $\lambda/\Lambda$ at the EUV blaze wavelength $\lambda$, and based on the above design prescription for the mirror, the grating period $\Lambda$ will be sufficiently short to separate the light cones 602 and 604 at the IF aperture (i.e., $\theta$ will exceed $\delta$). Moreover, the wavelength scaling factor in the angular deviation ensures that all diffracted out-of-band radiation, not just the zero order, will also be excluded from the IF aperture. For example, if the in-band EUV at wavelength 13.5 nm is concentrated in a first diffraction order, which deviates from the zero order by angle $\theta$, then the first diffraction order at wavelength 27 nm (2×13.5 nm) will deviate from the zero order by approximately $2\theta$. FIGS. 6 and 7 illustrate the diffracted beam 605 at wavelength 27 nm, which fills light cone 606 from point 208. This light cone is excluded from the IF aperture because of its greater deviation angle.

The system is thus able to direct all or most (i.e., at least half) of the collected in-band radiation power through the IF aperture while excluding all or most (at least half) of the collected out-of-band radiation power—zero-order and diffracted—above a particular cutoff wavelength (e.g., 27 nm in the above example). The prior-art system of FIG. 2 relies on zero-order extinction to eliminate out-of-band radiation, but the FIG. 6 system does not rely on efficiency tuning; it utilizes the grating's wavelength dispersion to achieve full out-of-band rejection.

The grating can, in general, be designed to diffract the in-band radiation into some m-th diffraction order (for non-zero m). The deviation angle $\theta$ for wavelength $\lambda$ is approximately $$\theta \approx |m|\lambda/\Lambda$$

(This approximation is for near-normal incidence; for oblique incidence $\theta$ is larger in inverse proportion to the cosine of the incidence angle on the collection mirror.) The wavelength dependence of $\theta$ results in exclusion of out-of-band radiation, but with a high-order grating the out-of-band rejection range would not extend as far into the short-wavelength range relative to a first-order grating. For example, if the grating in FIG. 7 is blazed for an order m greater than 1, then the grating period and height dimensions $\Lambda$ and h are both increased by a factor of m relative to an order-1 grating, and light cone 604 represents in-band radiation in diffraction order m, which is well-separated from out-of-band radiation in the zero-order light cone 602. In this case light cone 606 represents the order-m diffracted beam at wavelength $2\lambda$, where $\lambda$ is the in-band blaze wavelength (13.5 nm). This light cone is also well-separated from the in-band light cone 604, but lower diffraction orders at wavelength 2Λ are diffracted at smaller deviation angles and could therefore intercept the IF aperture. On the other hand, light cone 606 also represents first-order diffraction at the larger wavelength 2m λ. This wavelength, and all higher wavelengths, will be excluded from the IF aperture. In general, for an order-m grating the out-of-band cutoff wavelength is approximately equal to the in-band blaze wavelength times 2|m|.

Figure 1:
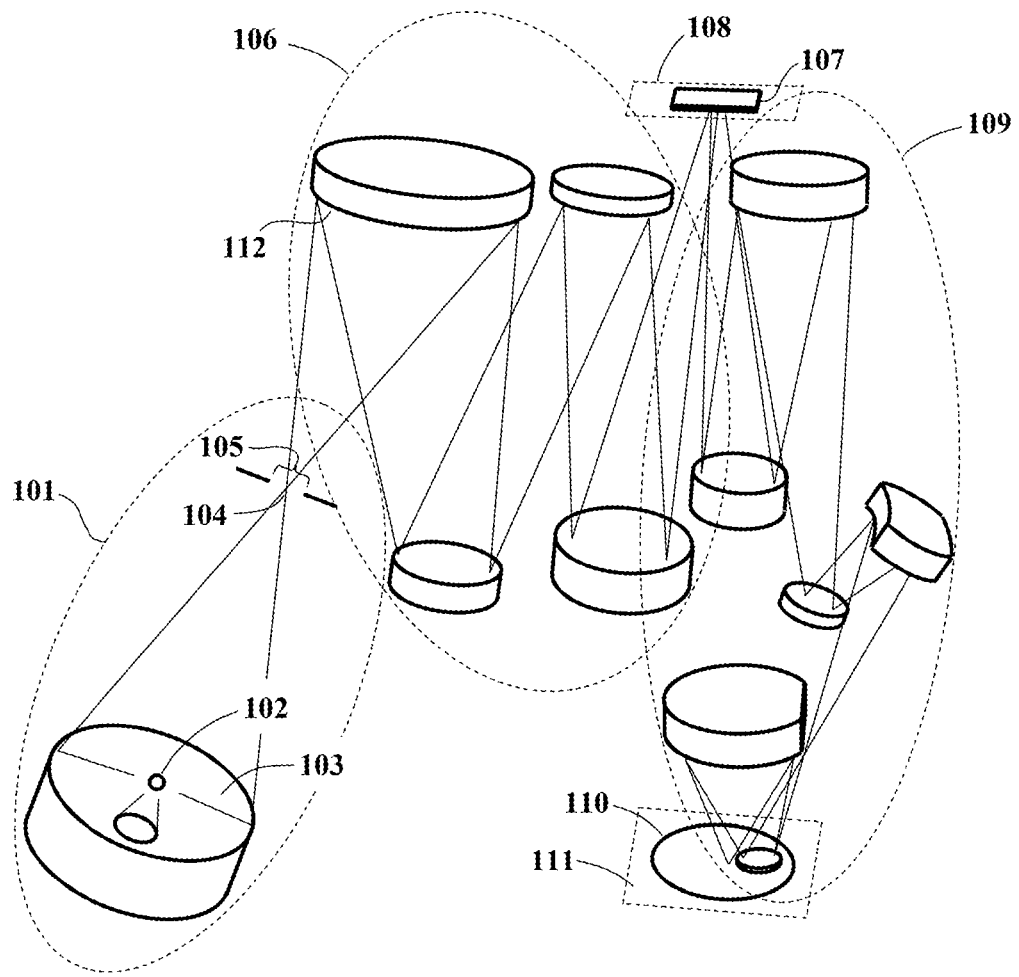
FIG. 1 illustrates a prior-art EUV lithography system.

The wavelength proportionality of θ will also result in some angular dispersion of the light cone 604 over the in-band wavelength range. The EUV mirrors in a lithography system (FIG. 1) typically have a collective 2% spectral bandwidth centered at wavelength 13.5 nm; thus θ will exhibit a 2% angular spread over the EUV spectral range. This is not a limitation if θ does not greatly exceed the plasma subtend angle δ, which is typically of order 1 mrad. If θ is equal to δ then the period Λ will be approximately λ/δ (e.g., 13.5 nm/0.001, or 13.5 μm) for first-order diffraction and near-normal incidence, and the in-band angular spread will be 0.02 δ (e.g., 20 μrad). Λ should generally be smaller than λ/δ to ensure adequate separation of light cones 602 and 604 in FIG. 6, but should not be too much smaller; otherwise the diffracted EUV beam may be excessively dispersed.

If the in-band spectral dispersion is significant, then the first mirror 112 in the illumination system (FIG. 1) can be designed as a diffractive mirror, which uses a diffraction grating similar to element 701 to nullify the dispersion.

Grating Design

The blazed diffraction grating 701 in FIG. 7 is a type of "phase-Fresnel mirror", which is analogous to a phase-Fresnel lens. [Miyamoto] A phase-Fresnel optic is a grating-type surface (reflecting or transmitting) with a sawtooth profile similar to a Fresnel lens (or Fresnel mirror), which preserves optical phase coherence between Fresnel facets at a particular "blaze" wavelength. A phase-Fresnel mirror is commonly formed as a surface-relief structure on a front-surface reflector, but an EUV phase-Fresnel mirror such as element 701 comprises a surface relief pattern formed in or under a multilayer reflective film.

Figure 4A:
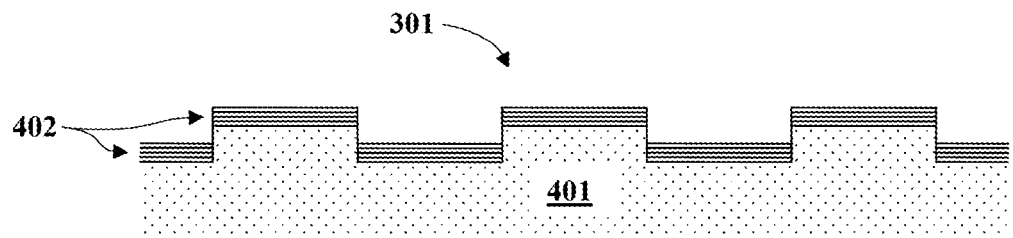
FIGS. 4A, 4B, and 4C illustrate alternative spectral-filter diffraction gratings for the prior-art LPP source of FIGS. 2 and 3.
Figure 4B:
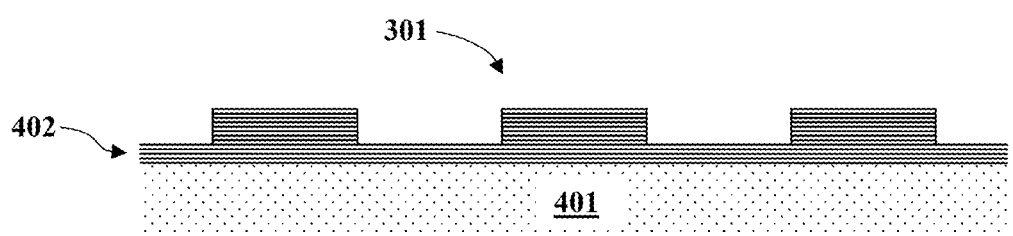

Lamellar (rectangular-profile) gratings of the type illustrated in FIGS. 4A and 4B are sometimes described as "Fresnel zone" patterns (e.g., in Bayraktar), which are different from "phase-Fresnel" (sawtooth-profile) patterns.

Figure 8:
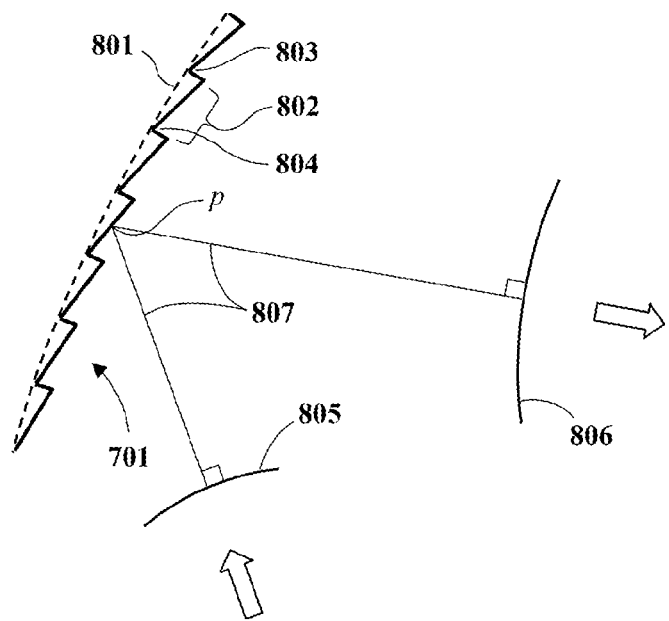
FIG. 8 illustrates the cross-sectional geometry and diffracting characteristics of a phase-Fresnel mirror.

FIG. 8 illustrates the cross-sectional geometry and diffracting characteristics of a phase-Fresnel mirror such as element 701. On a microscopic scale the element comprises an approximately periodic, sawtooth-profile grating structure patterned in or on a curved substrate. An incident beam of any particular wavelength λ is reflectively diffracted by the grating, which induces a periodicity in the reflected electromagnetic field corresponding to the grating periodicity. The Fourier orders of the diffracted field correspond to distinct diffraction orders, which propagate away from the grating in different directions.

The grating is proximate an imaginary, smooth (unpatterned) "zero-order reference surface" 801, which follows the substrate contour. This surface defines the grating's zero-order reflectance characteristics. The zero order represents undiffracted radiation, which propagates as though it were geometrically reflected by the reference surface.

The grating zones (i.e., periods) such as zone 802 in FIG. 8 are delimited by zone boundary curves in the reference surface, such as boundaries 803 and 804 delimiting zone 802. The boundary curves are constructed to direct a particular m-th diffraction order in a preferred direction (toward the IF) for a specified incident beam of a particular design wavelength (e.g., 13.5 nm), and the grating geometry in each zone is optimized ("blazed") to concentrate the diffraction energy in order m. (m is non-zero.)

The incident beam is characterized by a wavefront 805 (a surface of constant optical phase), and the diffracted beam in any particular order m is similarly characterized by a wavefront 806. A geometric ray 807 between wavefronts 805 and 806 consists of two ray segments, one from wavefront 805 to an intercept point p on the grating and the other from point p to wavefront 806, wherein the segments are perpendicular to the respective wavefronts. Each such ray is characterized by a geometric phase, defined as the sum of the two segment lengths divided by λ, plus any grating-induced optical phase shift at point p. (This defines the phase difference between wavefronts 805 and 806 in cycle units; 1 cycle=2π radian.) The geometric phase is a function of the intercept point p, the wavelength λ, and the order number m.

The geometric phase is generally continuous over points p within each zone, and is substantially discontinuous (i.e., abruptly changes) across the zone boundaries of a phase-Fresnel mirror. The zone boundary geometry can be designed as follows: The reference surface 801, the design wavelength λ, the order number m, and the two wavefronts 805 and 806 are all predetermined. (In the context of the FIG. 6 embodiment wavefronts 805 and 806 are spherical and centered at the plasma 207 and IF 104, respectively, and the reference surface shape is determined to direct zero-order reflected radiation outside of the IF aperture 105.) The zone boundaries are defined so that the geometric phase is constant on each boundary and differs by m between adjacent boundaries. With the zone boundaries defined, the grating is blazed for optimum diffraction efficiency in order m by making the geometric phase substantially constant within each zone.

The blaze condition, as defined above, may not be applicable to very short-period gratings because near-field diffraction effects may not make it possible to achieve the constant-phase condition. Accurate computational electromagnetic simulations can be used in such cases to optimize the grating design. Generally, "blazing" means optimizing the grating design for maximal diffraction efficiency at a particular wavelength and in a particular diffraction order. An accurately blazed grating might not have the exact sawtooth form illustrated in FIG. 8, although a sawtooth form can be used as a starting point for grating design optimization.

FIG. 8 schematically illustrates the grating 701 as a clearly defined surface, but with EUV mirrors there is no distinct reflective surface because the reflection is distributed through the volume of a multilayer coating. But the above-outlined grating design procedure can be adapted for EUV as follows: The incident and diffracted electromagnetic fields are analytically extrapolated to the reference surface 801; the ray intercept point p is on the reference surface; and the geometric phase function at p is defined to include any grating-induced optical phase offset between the extrapolated incident and order-m diffracted fields.

The ratio of the extrapolated diffracted field amplitude to the extrapolated incident field amplitude on the reference surface defines an effective surface reflectance factor, which is an approximately periodic function of a "zone number", a function of spatial coordinates that is continuous in the vicinity of the reference surface and takes on integer values on the zone boundaries. The reflectance function has period 1, and this periodicity (with respect to zone number, not with respect to spatial coordinates) defines the Fourier orders of the reflectance factor and corresponding diffraction orders in the diffracted field.

Conformal-Multilayer Grating

Figure 5:
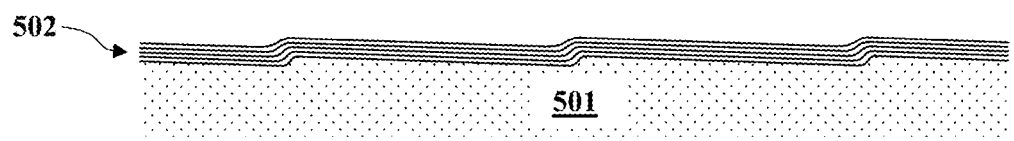
FIG. 5 illustrates another type of prior-art diffraction grating.

For a conformal-multilayer grating of the type illustrated in FIG. 5, a grating step height of h between grating zones induces a phase shift of h/λ in both the incident and reflected fields, resulting in a geometric phase discontinuity of 2h/λ across the zone boundaries. For order-m blazing the discontinuity is equal to |m|; thus $$h = \frac{1}{2}|m|\lambda.$$

For example, the grating can be blazed for first-order diffraction at wavelength 13.5 nm with a step height of only 6.75 nm. (The above equation assumes near-normal incidence; for oblique incidence h is larger in inverse proportion to the cosine of the incidence angle.) The 6.75-nm step is comparable to a single bilayer thickness in a Mo/Si multilayer reflective film.

Figure 3:
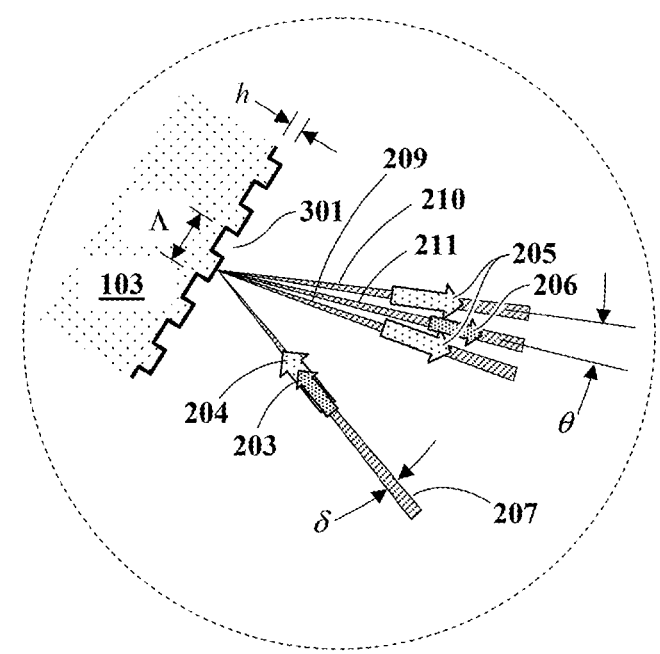

Voronov et al. demonstrate the performance capabilities of extremely short-period, conformal-multilayer gratings. In one case a first-order blazed grating with a 40-bilayer Mo/Si film stack of total thickness of 270 nm has a period of only 190 nm. The grating exhibits peak EUV reflectance close to 40%. (See FIGS. 2 and 3 in Voronov et al.) A longer-period grating designed for second-order operation exhibits higher efficiency (52%). Conformal-multilayer EUV gratings for LPP spectral filtering would have contour height dimensions similar to Voronov et al., but the grating period would typically be larger by over an order of magnitude. Long-period gratings have several advantages for spectral filtering: They can have relatively high diffraction efficiency (e.g., around 70% at 13.5 nm), are relatively easy to manufacture, and exhibit minimal chromatic dispersion over the in-band wavelength range.

The wavelength selectivity of a blazed, conformal-multilayer grating would not differ significantly from an unpatterned multilayer reflector. Based on Fourier-optics approximations, the order-m diffraction efficiency η of a phase-Fresnel grating at wavelength λ is η=sinc²[mπ(λ$_B$/2−1)]

where λ$_B$ is the order-m blaze wavelength (e.g., 13.5 nm) and $$sinc[x] = \frac{\sin[x]}{x}; sinc[0] = 1.$$

(Square braces "[ . . . ]" delimit function arguments.) This represents the efficiency relative to an unpatterned multi-layer mirror. Within the 2% wavelength band of in-band EUV radiation the factor Δ$_B$/λ is in the range 0.99 to 1.01, and with first-order blazing η exceeds 0.99967 over the full in-band spectrum. Even with 10$^{th}$-order blazing the grating efficiency loss would be less than 4%.

The conformal-multilayer EUV gratings demonstrated by Voronov et al. were fabricated on a crystalline silicon substrate, using the crystal planes to define atomically smooth and flat grating facets. Other fabrication methods can be applied to form similar grating patterns on curved mirror substrates. Kriese et al. formed a lamellar grating topography in a nickel-plated substrate using single-point diamond turning followed by application of a smoothing layer to remove the diamond machining marks. Feigl et al. constructed complex grating structures by ion etching into a polished nickel mirror. Phase-Fresnel gratings could also be formed by an "ion turning" process analogous to diamond turning but using a focused ion beam in place of the diamond cutter. Moriya et al. describe a similar manufacturing process for patterning grating grooves in a multilayer film, and the same approach can be used for patterning a mirror substrate. (See FIG. 10 in Moriya.)

The linear-profile, sawtooth form of phase Fresnel facets can be approximated by a multi-level, stepped profile, which can be fabricated by ion-beam (or e-beam) patterning of a multilayer film with embedded etch stops. [Smith et al. (U.S. Pat. No. 6,187,211)] The last patterning step selectively etches the structure down to the etch-stop layers, so the grating profile can be controlled to atomic-scale depth dimensions if a deposition process such as magnetron sputtering or atomic layer deposition is used.

Patterned-Multilayer Grating

Figure 4C:
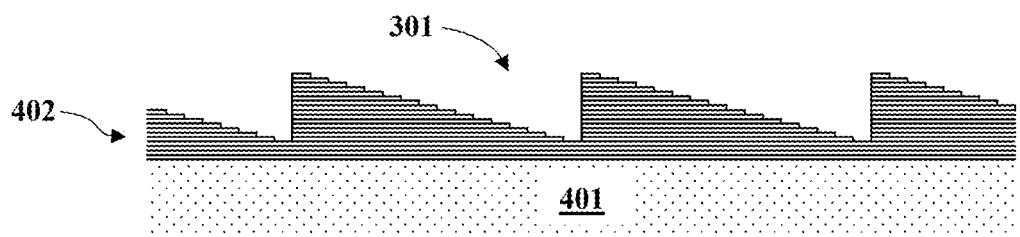

In the context of the FIG. 7 embodiment, a patterned-multilayer grating would be qualitatively similar to the structure disclosed by Moriya et al. (FIG. 4C), but would have significant functional and structural differences. The grating is blazed for in-band EUV radiation (e.g., 13.5-nm), not for out-of-band IR radiation (e.g., 10.6-μm). Consequently the grating profile dimensions are much smaller, and comparatively few patterned Mo/Si bilayers would be needed. For example, high diffraction efficiency (close to 70%) may be achievable, at near-normal incidence, with 27 patterned bilayers on an unpatterned, 40-bilayer substructure (in contrast to the 300-bilayer structure of Embodiment 1 in Moriya et al.).

Patterned-multilayer gratings could be more manufacturable than conformal-multilayer gratings because patterning imperfections would only affect the top surface (whereas patterning errors in the FIG. 5 structure would affect the entire multilayer stack). Such gratings could be useful not only for LPP spectral filtering, but also for applications such as EUV spectroscopy, which require EUV gratings on curved substrates.

A patterned-multilayer grating can be fabricated by depositing a conventional Mo/Si multilayer film stack on a superpolished substrate and then removing layers from selected areas by a process such as diamond turning, ion turning, focused-ion-beam milling, or lithographic patterning and etching. The layers on each selected area can be removed down to one of the silicon layers, which can then be selectively etched down to the underlying molybdenum layer (using the Mo as an etch stop) to form an atomically smooth top surface. A corrosion-resistant capping layer can then be conformally deposited on the patterned structure. The selective etch step may be unnecessary if a capping layer such as silicon is used. (The refractive index of silicon is very close to 1 at EUV wavelengths, so patterning imperfections in the silicon may be inconsequential.)

Figure 9:
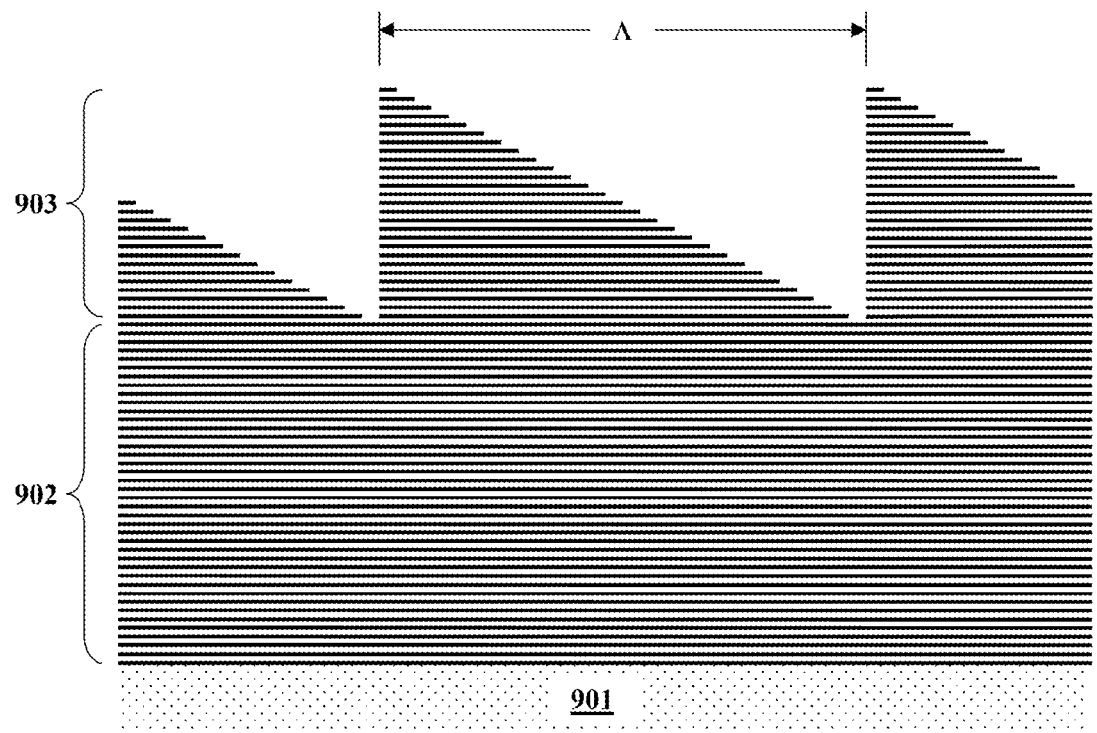
FIG. 9 illustrates a patterned-multilayer grating that is blazed for efficient EUV diffraction.

FIG. 9 shows an illustrative example of a patterned-multilayer grating structure (in cross section). The grating has a period λ of 5 μm and is optimized for a blaze wavelength of 13.5 nm at normal incidence. The structure comprises a Ni substrate 901, 40 unpatterned Mo/Si bilayers 902, and 27 patterned Mo/Si bilayers 903. The Mo and Si layer thicknesses are 3.33 nm and 3.66 nm, respectively, and the entire structure has a depth of 0.4 μm. (The aspect ratio of the figure is compressed by approximately a factor of 13 for clarity of illustration.)

Figure 10:
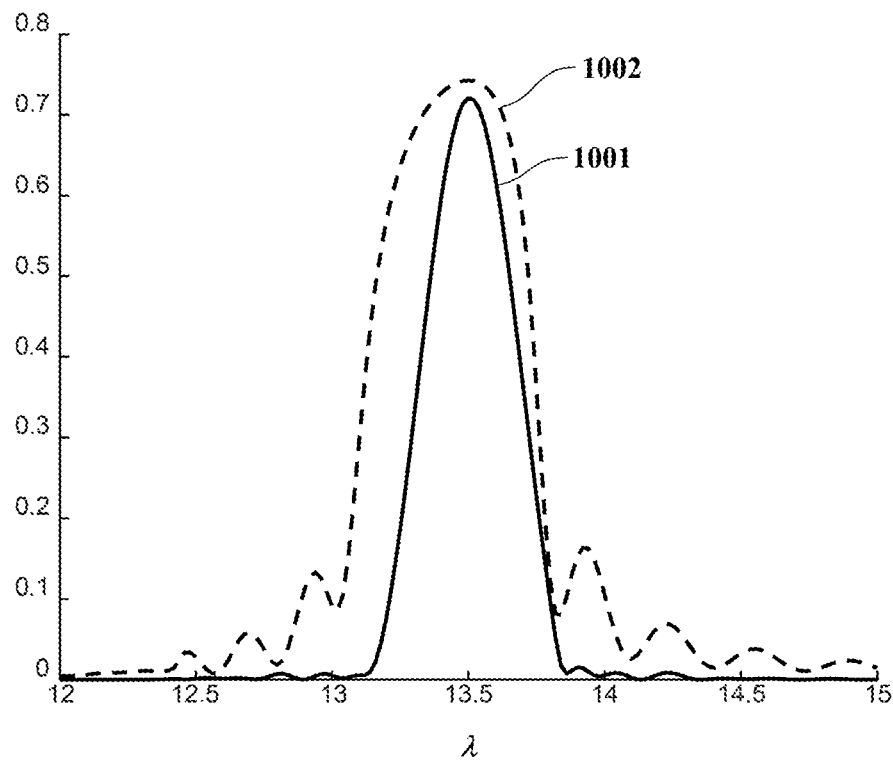
FIG. 10 illustrates the calculated diffraction efficiency of the FIG. 9 grating versus wavelength, in comparison to a conventional multilayer EUV mirror's reflection efficiency.

FIG. 10 shows the calculated first-order diffraction efficiency 1001 of the FIG. 9 grating versus wavelength λ at normal incidence. The assumed material optical constants are obtained from the CXRO X-Ray Database (http://henke.lbl.gov/optical_constants/getdb2.html), and the diffraction simulations were performed with GD-Calc (http://kjinnovation.com/GD-Calc.html). The simulation model did not include a cap layer or any interlayer diffusion.

For comparison, FIG. 10 also shows the calculated normal-incidence reflectance 1002 of a 40-bilayer Mo/Si mirror (unpatterned) with Mo and Si layer thicknesses of 2.79 nm and 4.12 nm, respectively. (For both structures the layer thicknesses were optimized for maximum efficiency at 13.5 nm.) The grating's efficiency band is narrower than that of an unpatterned mirror, but the reduced efficiency would be minor over the 2% in-band spectrum.

A patterned-multilayer grating such as that in FIG. 9 can be designed by the following procedure: The layer thicknesses are chosen so that each Mo/Si bilayer has a half-cycle optical phase depth, for a double-pass phase shift of 1 cycle at a particular design wavelength λ. (The allocation of the phase depth between the Mo and Si layers can initially be determined to maximize reflectance of an unpatterned multilayer mirror.) Removal of a single bilayer replaces it by a vacuum layer with a double-pass phase shift to $2t/\lambda$, where t is the bilayer thickness. Thus, the phase change induced by the bilayer removal is $2 t/\lambda-1$ cycle. (For non-normal incidence, the $2t/\lambda$ term would include an extra factor of the cosine of the incidence angle.) The geometric phase discontinuity across the zone boundaries in FIG. 9 is N $(2t/\lambda-1)$, where N is the number of patterned bilayers 903. This value should equate approximately to m cycles for an order-m grating; hence N has the approximate value $$N \approx m/(2t/\lambda-1)$$

For the FIG. 9 design, t is 6.99 nm, λ is 13.5 nm, m is 1, and N was determined from the above equation to be approximately 28. The initial Mo and Si layer thicknesses and N were subsequently optimized for maximum diffraction efficiency at 13.5 nm. The design could be further improved by independently optimizing the individual layer thicknesses and the patterned layers' lateral boundary locations.

Power Recycling

Figure 11:
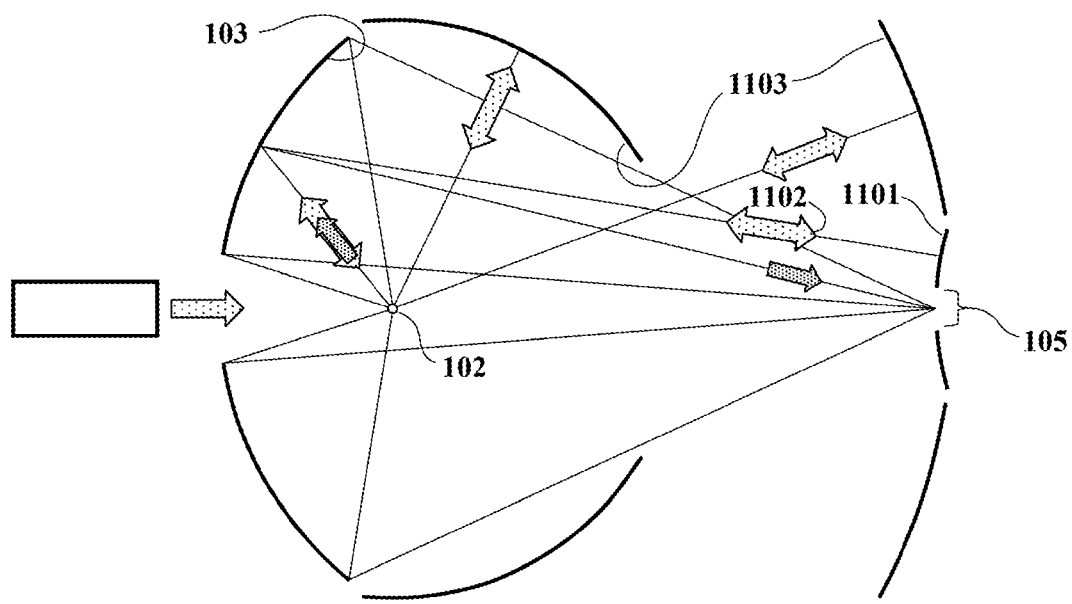
FIG. 11 illustrates an LPP radiation source with power recycling via retroreflection of out-of-band radiation.

FIG. 11 illustrates a variant of the FIG. 6 system with power recycling. The IF aperture 105 can be formed in an annular mirror 1101, which retroreflects zero-order, out-of-band radiation 1102 back to the collection mirror 103 and onto the plasma 102 to enhance generation of in-band radiation by the plasma. Also, spherical-shell retroreflective mirrors 1103 can be arrayed around the plasma to recycle out-of-band radiation that does not intercept the collection mirror.

A system that recycles even a small portion (e.g. 10% or less) of the radiation power back to the plasma would be useful if the economic benefit of power recycling, in terms of enhanced generation of in-band radiation power (per unit of drive laser power), exceeds the added cost of the power recycling elements. The system need only recycle a portion of the plasma radiation sufficient to yield a detectable and useful increase of in-band power generation relative to the drive laser power, but for specificity a 1% portion can be considered a lower limit for practical utility.

A possible limitation of the system illustrated in FIG. 11 is that the retroreflective mirrors form an inverted image of the plasma onto itself. Only one plasma point at the design focus position is accurately imaged onto itself, and any positional displacement of the plasma will cause its self-image to move in the opposite direction. Consequently, the power recycling efficiency would be sensitive to the plasma position, and statistical variations in the plasma location could result in EUV output power fluctuations. However, in the FIG. 11 configuration the plasma is almost entirely surrounded by retroreflectors, so portions of the reflected radiation that do not intercept the plasma will be again retroreflected to form a twice-inverted plasma image, which will tend to track the plasma's positional variations and mitigate power fluctuations. (The two image inversions result in a non-inverted image.)

Figure 12:
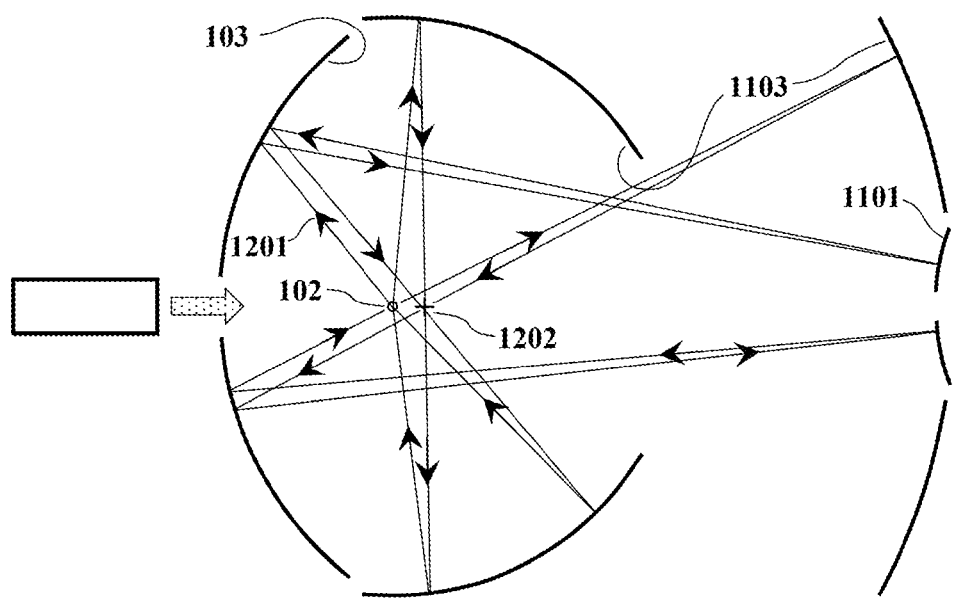
FIG. 12 illustrates power recycling via "relay imaging" to form a non-inverted plasma self-image.

The mirrors can be designed to intentionally image the plasma to a separate conjugate focal point, which is axially displaced from the plasma, to ensure accurate and stable plasma self-imaging. For example, FIG. 12 shows several illustrative optical rays (e.g., ray 1201) originating from the plasma 102 and being reflected by mirrors 103, 1101, and 1103 through the conjugate focal point 1202 and then back to the plasma to form a non-inverted plasma self-image. This retroreflection method can be termed "relay imaging", in contrast to the "direct imaging" approach illustrated in FIG. 11. (The reflected rays do not retrace the incident ray path back to the plasma, but the mirrors are described herein as "retroreflectors" in the general sense that they reflect plasma-emitted radiation back to the plasma.)

Relay imaging could be useful, for example, to recycle LPP power during both the pre-pulse and the main-pulse plasma irradiation phases. The plasma would typically be displaced by 150 µm between the two pulses [Purvis et al.], but a non-inverted plasma self-image would automatically track the motion.

One possible concern with power recycling is the time delay resulting from to the finite speed of light (300 mm/nsec). However, the recycling time would be a fraction of the typical $CO_2$ laser pulse width, which is of order 20 nsec. Moreover, the time delay could help smooth out erratic short-term fluctuations in the laser power. (See FIG. 6 in Hassanein et al.) Multiple retroreflective mirrors, such as elements 1103 in FIGS. 11 and 12, can be positioned at various distances from the plasma to optimize the temporal irradiation profile.

The time delay would be more significant if a substantial portion of the plasma irradiation comes from multiple scattering/retroreflection cycles. But the delay time can be reduced, while still producing a non-inverted plasma self-image, by using alternative retroreflection means such as cat's-eye reflector arrays or corner-cube reflector arrays, as described below.

Cat's-Eye Reflectors

Figure 13:
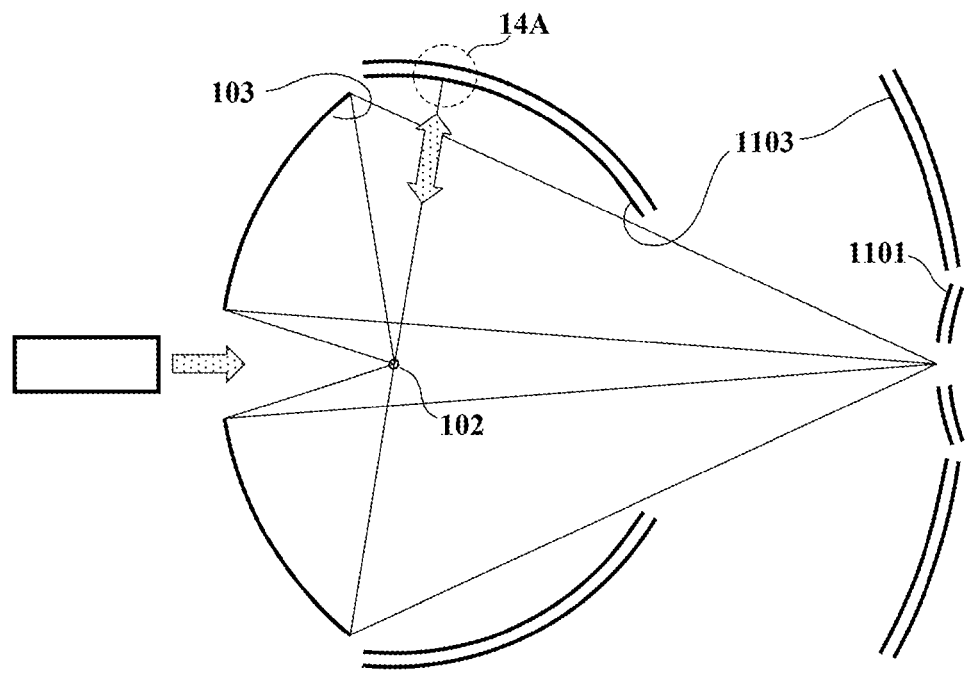

FIG. 13 and the enlarged view in FIG. 14A illustrate a variation of FIG. 11 in which the retroreflective mirrors 1101 and 1103 are double-shell elements, each comprising a transmitting inner shell and a reflecting outer shell. FIG. 14A shows an expanded cross-sectional view of a double-shell element. The inner shell comprises an array of lenses, such as lens 1401, which images the plasma onto a focal point 1402 on the outer shell. A reflective element 1403 of the outer shell retroreflects the plasma image back through lens 1401 and onto the plasma. Each lens 1401 and the associated retroreflective element 1403 of the outer shell operate as a cat's-eye reflector 1404.

A variety of alternative cat's-eye configurations are possible. The reflector elements 1403 can optionally be curved, as illustrated, to image the lens pupil onto itself. The lenses and/or reflector elements can be Fresnel elements. The shells can possibly comprise flat plates, using off-axis lenses and/or reflectors to accommodate the plasma-emitted beam divergence. The space between the two shells could be filled with solid dielectric material, in which case the outer shell would simply be a reflective mirror coating formed on the inner shell's back side.

The cat's-eye array elements need not be formed contiguously on shell elements; they could be discrete components as illustrated in FIG. 14B. (This is an alternative to the FIG. 14A embodiment, comprising similar elements in a different configuration.) In this illustration, each cat's-eye reflector 1404 is a solid glass element with a convex lens surface 1401 and a flat, reflective back surface 1403. The lens axes are aligned to the plasma center, but the alignment tolerance can be much looser than the plasma subtend angle at the reflector.

The solid angular emission range around the plasma can be efficiently partitioned between individual cat's-eye reflectors by using a Goldberg polyhedron as an aperture patterning template. (See https://en.wikipedia.org/wiki/Goldberg_polyhedron.) Each cat's-eye aperture would be delimited by the solid angular range defined by one of the polyhedron faces.

Each cat's-eye element will form a non-inverted self-image of the plasma. The cat's-eye aperture dimensions should be large enough to avoid excessive image broadening from aperture diffraction. (This condition can be achieved by making the subtend angle of the aperture at the plasma comparable to, or larger than, the convergence angle of the drive laser beam.)

A possible limitation of cat's-eye reflectors is chromatic aberration in the lens over the out-of-band spectrum. Also, infrared lens materials (e.g., zinc selenide, ZnSe, for 10.6-μm IR) have transmittance limitations. These limitations could be overcome by using parabolic mirror focusing elements instead of lenses, or by using corner-cube reflectors as described below.

Corner-Cube Reflectors

FIG. 15 and the enlarged view in FIG. 16A illustrate another variation of FIG. 11 in which the retroreflective mirrors 1101 and 1103 are corner-cube reflector arrays. The mirrors are illustrated schematically by a sawtooth profile, but each corner-cube element 1601 has a three reflector surfaces. The corner-cube elements need not be formed as a contiguous array; they can alternatively be discrete components as illustrated in FIG. 16B.

FIG. 17 illustrates a portion of a conventional corner-cube array, including shaded corner-cube element 1601. In this perspective view the incident beam 1701 reflects off the top of the array. Each corner cube's three reflective surfaces are planar, square, and mutually orthogonal, and the cube's aperture projection 1702 in the incidence direction is a regular hexagon. The device operates to retroreflect a collimated beam directed approximately parallel to an optical axis, which is oriented at the same angle (approximately 54.7°) to all three reflector surface normals. The hexagonal aperture geometry can retroreflect rays that are parallel to the axis without geometric efficiency loss. Alternative aperture forms could also be used with only minor efficiency loss.

A conventional corner-cube design can be modified to achieve accurate self-imaging of an axial point at finite conjugate by making the reflector surfaces slightly concave, as described in Macken (U.S. Pat. No. 4,941,731). (See Macken at 5:5-18 and FIG. 4.) The surface geometry has sufficient degrees of freedom to achieve perfect geometric self-imaging of the plasma center point (although the optimal surface shape might not be exactly spherical as described by Macken).

A curved-surface corner-cube reflector will form a non-inverted self-image of the plasma. As with the cat's-eye array, the subtend angle of each corner-cube aperture at the plasma should generally be comparable to, or larger than, the convergence angle of the drive laser beam to avoid excessive image degradation from aperture diffraction. The aperture layout can be designed by using a Goldberg polyhedron as a patterning template.

Figure 18:
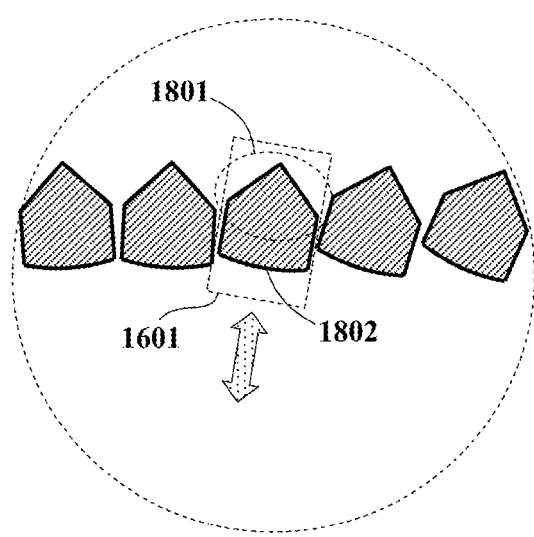

A variety of alternative corner-cube configurations are possible, one of which is shown in FIG. 18. (This is an alternative to the 16B embodiment.) Each corner-cube reflector 1601 is a solid glass prism with three orthogonal, flat-face reflector surfaces 1801, which operate via total internal reflection. (FIG. 18 is only a schematic; the actual reflector geometry is realistically illustrated in FIG. 17.) The reflector surfaces are flat; they are not curved as in Macken's design because plasma-emitted radiation is collimated by a front-surface lens 1802.

Chromatic aberration would not be significant because the lens would have very little optical power. Moreover, a hybrid diffractive/refractive lens surface (i.e., a phase-Fresnel lens on a curved substrate) could be used to achieve two-wavelength chromatic correction. Subwavelength surface nanostructures ("moth-eye" patterns) can be used to provide wideband antireflection performance.

Solid prism reflectors could be useful for LPP applications such as EUV inspection and metrology, which use a relatively short-wavelength (e.g., 1-μm) drive laser. A prism material such as UV-grade fused silica could be used for such applications. For lithography applications using a $CO_2$ laser (10.6-μm), zinc selenide prism reflectors could be used to at least recycle IR radiation.

PATENT REFERENCES

The following patent references are cited in this application, and their entire disclosures are incorporated by reference for all purposes:

Bristol, Robert. "EUV source box." U.S. Pat. No. 6,809,327. 26 Oct. 2004.

Chapman, Henry N. "High-efficiency spectral purity filter for EUV lithography." U.S. Pat. No. 7,050,237. 23 May 2006.

Macken, John. "Corner cube utilizing generally spherical surfaces." U.S. Pat. No. 4,941,731. 17 Jul. 1990.

Moriya, Masato, Osamu Wakabayashi, and Georg Soumagne. "Mirror for extreme ultra violet, manufacturing method for mirror for extreme ultra violet, and far ultraviolet light source device." U.S. Pat. No. 8,592,787. 26 Nov. 2013.

Smith, Donald L., et al. "Method for fabrication of multi-step structures using embedded etch stop layers." U.S. Pat. No. 6,187,211. 13 Feb. 2001.

Sweatt, William C., Daniel A. Tichenor, and Luis J. Bernardez. "Diffraction spectral filter for use in extreme-UV lithography condenser." U.S. Pat. No. 6,469,827. 22 Oct. 2002.

NON-PATENT REFERENCES

The following non-patent references are cited in this application, and their entire disclosures are incorporated by reference for all purposes:

Bayraktar, Muharrem, et al. "Spectral purification and infrared light recycling in extreme ultraviolet lithography sources." *Optics express* 22.7 (2014): 8633-8639. http://dx.doi.org/10.1364/OE.22.008633

Chkhalo, Nikolay I., et al. "Free-standing spectral purity filters for extreme ultraviolet lithography." *Journal of Micro/Nanolithography, MEMS, and MOEMS* 11.2 (2012): 021115-1. http://dx.doi.org/10.1117/1.JMM.11.2.021115

Feigl, Torsten, et al. "Sub-aperture EUV collector with dual-wavelength spectral purity filter." *SPIE Advanced Lithography*. International Society for Optics and Photonics, 2015. http://dx.doi.org/10.1117/12.2175666

Hassanein, A., et al. "Analysis, simulation, and experimental studies of YAG and CO2 laser-produced plasma for EUV lithography sources." *SPIE Advanced Lithography*. International Society for Optics and Photonics, 2010. http://dx.doi.org/10.1117/12.848222

Hori, Tsukasa, et al. "100 W EUV light-source key component technology update for HVM." *SPIE Advanced Lithography*. International Society for Optics and Photonics, 2016. http://dx.doi.org/10.1117/12.2217947

Kierey, Holger, et al. "EUV spectral purity filter: optical and mechanical design, grating fabrication, and testing." *Optical Science and Technology, SPIE's 48th Annual Meeting*. International Society for Optics and Photonics, 2004. http://dx.doi.org/10.1117/12.507741

Kriese, Michael, et al. "Development of an EUVL collector with infrared radiation suppression." *SPIE Advanced Lithography*. International Society for Optics and Photonics, 2014. http://dx.doi.org/10.1117/12.2049279

Liddle, J. Alexander, et al. "Nanoscale topography control for the fabrication of advanced diffractive optics." *Journal of Vacuum Science & Technology B* 21.6 (2003): 2980-2984. http://dx.doi.org/10.1116/1.1622938

Medvedev, V. V., et al. "Infrared antireflective filtering for extreme ultraviolet multilayer Bragg reflectors." *Optics letters* 37.7 (2012): 1169-1171. http://dx.doi.org/10.1364/OL.37.001169

Medvedev, V. V., et al. "Infrared diffractive filtering for extreme ultraviolet multilayer Bragg reflectors." *Optics express* 21.14 (2013): 16964-16974. http://dx.doi.org/10.1364/OE.21.016964

Migura, Sascha, et al. "Anamorphic high-NA EUV lithography optics." *31st European Mask and Lithography Conference*. International Society for Optics and Photonics, 2015. http://dx.doi.org/10.1117/12.2196393

Miyamoto, Kenro. "The phase Fresnel lens." *JOSA* 51.1 (1961): 17-20. http://dx.doi.org/10.1364/JOSA.51.000017

Park, Chang-Min, et al. "Prospects of DUV OoB suppression techniques in EUV lithography." *SPIE Advanced Lithography*. International Society for Optics and Photonics, 2014. http://dx.doi.org/10.1117/12.2046132

Purvis, Michael A., et al. "Advancements in predictive plasma formation modeling." *SPIE Advanced Lithography*. International Society for Optics and Photonics, 2016. http://dx.doi.org/10.1117/12.2221991

Rollinger, Bob, et al. "LPP light source for actinic HVM inspection applications." SPIE Advanced Lithography. International Society for Optics and Photonics, 2015. http://dx.doi.org/10.1117/12.2085794

Suzuki, Yukio, et al. "Free-standing subwavelength grid infrared cut filter of 90 mm diameter for LPP EUV light source." *Sensors and Actuators A: Physical* 231 (2015): 59-64. http://dx.doi.org/10.1016/j.sna.2014.07.006

Trost, Marcus, et al. "Structured Mo/Si multilayers for IR-suppression in laser-produced EUV light sources." *Optics express* 21.23 (2013): 27852-27864. http://dx.doi.org/10.1364/OE.21.027852 van den Boogaard, A. J. R., et al. "Optical element for full spectral purity from IR-generated EUV light sources." *SPIE Advanced Lithography*. International Society for Optics and Photonics, 2009. http://dx.doi.org/10.1117/12.829011 van den Boogaard, A. J. R., et al. "Wavelength separation from extreme ultraviolet mirrors using phaseshift reflection." *Optics letters* 37.2 (2012): 160-162. http://dx.doi.org/10.1364/OL.37.000160

Voronov, D. L., et al. "Enhancement of diffraction efficiency via higher-order operation of a multilayer blazed grating." *Optics letters* 39.11 (2014): 3157-3160. http://dx.doi.org/10.1364/OL.39.003157

CONCLUSION

The described embodiments illustrate the utility of an EUV-diffracting collection mirror for channeling spectrally pure, in-band EUV radiation from an LPP plasma through an intermediate-focus aperture and illumination optics for applications such as lithography or inspection and microscopy. Since an EUV-diffracting mirror is only weakly diffracting at long wavelengths, a large portion of the rejected out-of-band radiation will be undiffracted and can be efficiently retroreflected back to the mirror and onto the plasma to enhance generation of in-band radiation by the plasma. Much of the plasma-emitted radiation that does not intercept the collection mirror can also be recycled back to the plasma by a variety of means such as retroreflective mirrors, cat's-eye reflectors, or corner-cube reflectors.

While the above is a complete description of specific embodiments of the invention, the above description should not be taken as limiting the scope of the invention as defined by the claims.

What is claimed is:
1. An imaging system comprising:
apparatus for generating an ionized plasma from a laser-irradiated target,
a collection mirror comprising a reflective diffraction grating,
an intermediate-focus aperture,
illumination optics,
projection optics,
an object surface, and
an image surface
wherein:
the plasma generates in-band radiation comprising a range of emission wavelengths and out-of-band radiation comprising wavelengths greater than the in-band wavelengths;
the collection mirror collects and reflects a portion of the in-band and out-of-band radiation from the plasma;
the collection mirror is configured to reflectively direct undiffracted, zero-order radiation outside of the intermediate-focus aperture;
the diffraction grating is either (a) a conformal-multilayer grating comprising a substrate having a phase-Fresnel surface-relief structure, and a multilayer, reflective film stack deposited conformally on the phase-Fresnel structure, or (b) a patterned-multilayer grating comprising a smooth substrate and a multilayer, reflective film stack deposited on the substrate, with a phase-Fresnel surface-relief structure patterned in the film stack;

the diffraction grating is blazed for optimal diffraction efficiency of the in-band wavelengths, and is configured to diffractively reflect the collected in-band radiation toward the intermediate-focus aperture, whereby all or most of the collected in-band radiation transmits through the intermediate-focus aperture;

the grating has a sufficiently short period to achieve separation of the diffracted in-band radiation and undiffracted out-of-band radiation at the intermediate-focus aperture;

all or most of the out-of-band radiation is either not collected by the collection mirror, or is undiffracted by the grating, or is diffractively scattered outside of the intermediate-focus aperture, and in each case is thereby excluded from the intermediate-focus aperture;

the collection mirror and illumination optics are disposed on opposite sides of the intermediate-focus aperture;

the in-band radiation that transmits through the intermediate-focus aperture is conveyed by the illumination optics to illuminate a reflective photomask at the object surface; and the projection optics images the object surface onto the image surface.

2. The imaging system of claim 1 wherein:

the in-band radiation comprises EUV radiation within a wavelength band that includes 13.5 nm;

the diffraction grating operates in an m-th diffraction order for some non-zero integer m; and the out-of-band radiation comprises at least wavelengths greater than 2|m| times 13.5 nm.

3. An LPP radiation source comprising apparatus for generating an ionized plasma from a laser-irradiated target, a collection mirror comprising a reflective diffraction grating, an intermediate-focus aperture, and one or more reflective, power-recycling elements, wherein:

the plasma generates in-band radiation comprising a range of emission wavelengths, and out-of-band radiation comprising wavelengths greater than the in-band wavelengths;

the collection mirror collects and reflects a portion of the in-band and out-of-band radiation from the plasma;

the collection mirror is configured to reflectively direct undiffracted, zero-order radiation outside of the intermediate-focus aperture;

the diffraction grating is configured to diffractively reflect the collected in-band radiation toward the intermediate-focus aperture, whereby all or most of the collected in-band radiation transmits through the intermediate-focus aperture;

all or most of the out-of-band radiation is either not collected and reflected by the collection mirror, or is undiffracted by the grating, or is diffractively scattered outside of the intermediate-focus aperture, and in each case is thereby excluded from the intermediate-focus aperture; and the power-recycling elements intercept at least a portion of the reflected out-of-band radiation and further reflect it back to the collection mirror, which further reflects it back onto the plasma to enhance generation of in-band radiation by the plasma.

4. The LPP radiation source of claim 3 wherein:

the in-band radiation comprises EUV radiation within a wavelength band that includes 13.5 nm;

the diffraction grating operates in an m-th diffraction order for some non-zero integer m; and the out-of-band radiation comprises at least wavelengths greater than 2|m| times 13.5 nm.

5. The LPP radiation source of claim 3 wherein:

the diffraction grating is a conformal-multilayer grating comprising a substrate having a phase-Fresnel surface-relief structure, and a multilayer, reflective film stack deposited conformally on the phase-Fresnel structure;

the grating is blazed for optimal diffraction efficiency of the in-band wavelengths; and the grating has a sufficiently short period to achieve separation of the diffracted in-band radiation and undiffracted out-of-band radiation at the intermediate-focus aperture.

6. The LPP radiation source of claim 3 wherein:

the diffraction grating is a patterned-multilayer grating comprising a smooth substrate and a multilayer, reflective film stack deposited on the substrate, with a phase-Fresnel surface-relief structure patterned in the film stack;

the grating is blazed for optimal diffraction efficiency of the in-band wavelengths; and the grating has a sufficiently short period to achieve separation of the diffracted in-band radiation and undiffracted out-of-band radiation at the intermediate-focus aperture.

7. The LPP radiation source of claim 3 wherein the power-recycling elements comprise one or more retroreflective mirrors.

8. The LPP radiation source of claim 3 wherein the power-recycling elements comprise cat's-eye reflectors.

9. The LPP radiation source of claim 3 wherein the power-recycling elements comprise corner-cube reflectors.

10. An LPP radiation source comprising:

apparatus for generating an ionized plasma from a laser-irradiated target, a collection mirror, an intermediate-focus aperture, and one or more reflective, power-recycling elements, wherein:

the plasma generates in-band radiation comprising a range of emission wavelengths and out-of-band radiation comprising wavelengths greater than the in-band wavelengths;

the collection mirror collects a portion of the in-band radiation from the plasma and reflects it toward and through the intermediate-focus aperture; and the power-recycling elements intercept at least a portion of the plasma-generated out-of-band radiation that has not intercepted the collection mirror, and reflect it back onto the plasma to enhance generation of in-band radiation by the plasma.

11. The LPP radiation source of claim 10 wherein the power-recycling elements comprise one or more retroreflective mirrors.

12. The LPP radiation source of claim 10 wherein the power-recycling elements comprise cat's-eye reflectors.

13. The LPP radiation source of claim 10 wherein the power-recycling elements comprise corner-cube reflectors.

14. An LPP radiation source comprising apparatus for generating an ionized plasma from a laser-irradiated target, a collection mirror comprising a reflective diffraction grating, an intermediate-focus aperture,
one or more first reflective, power-recycling mirrors, and
one or more second reflective, power-recycling mirrors,
wherein:

the plasma generates in-band radiation comprising a range of emission wavelengths and out-of-band radiation comprising wavelengths greater than the in-band wavelengths;

the collection mirror collects and reflects a portion of the in-band and out-of-band radiation from the plasma;

the collection mirror is configured to reflectively direct undiffracted, zero-order radiation outside of the intermediate-focus aperture;

the diffraction grating is configured to diffractively reflect the collected in-band radiation toward the intermediate-focus aperture, whereby all or most of the collected in-band radiation transmits through the intermediate-focus aperture;

all or most of the out-of-band radiation is either not collected by the collection mirror, or is undiffracted by the grating, or is diffractively scattered outside of the intermediate-focus aperture, and in each case is thereby excluded from the intermediate-focus aperture;

the first power-recycling mirrors intercept at least a portion of the reflected out-of-band radiation and further reflect it back to the collection mirror, which further reflects it through a first plasma image;

the second power-recycling mirrors intercept at least a portion of out-of-band radiation that has not been collected by the collection mirror, and reflect it through the first plasma image;

a portion of the radiation transmitted through the first plasma image from the first and second power-recycling mirrors is further collected and reflected by the collection mirror, intercepted and reflected by the first power-recycling mirrors back to the collection mirror, and then reflected by the collection mirror back onto the plasma; and a portion of the radiation transmitted through the first plasma image from the first and second power-recycling mirrors is further reflected by the second power-recycling mirrors back onto the plasma;

whereby the first and second power-recycling mirrors form a non-inverted, second plasma image superimposed on the plasma to enhance generation of in-band radiation by the plasma.

15. The LPP radiation source of claim 14 wherein the in-band radiation comprises EUV radiation within a wavelength band that includes 13.5 nm, the diffraction grating operates in an m-th diffraction order for some non-zero integer m, and the out-of-band radiation comprises at least wavelengths greater than $2|m|$ times 13.5 nm.

16. The LPP radiation source of claim 14 wherein:
the diffraction grating is a conformal-multilayer grating comprising a substrate having a phase-Fresnel surface-relief structure, and a multilayer, reflective film stack deposited conformally on the phase-Fresnel structure;
the grating is blazed for optimal diffraction efficiency of the in-band wavelengths; and
the grating has a sufficiently short period to achieve separation of the diffracted in-band radiation and undiffracted out-of-band radiation at the intermediate-focus aperture.

17. The LPP radiation source of claim 14 wherein:
the diffraction grating is a patterned-multilayer grating comprising a smooth substrate and a multilayer, reflective film stack deposited on the substrate, with a phase-Fresnel surface-relief structure patterned in the film stack;
the grating is blazed for optimal diffraction efficiency of the in-band wavelengths; and
the grating has a sufficiently short period to achieve separation of the diffracted in-band radiation and undiffracted out-of-band radiation at the intermediate-focus aperture.

* * * * *

UNITED STATES PATENT AND TRADEMARK OFFICE
CERTIFICATE OF CORRECTION

PATENT NO. : 9,612,370 B1
APPLICATION NO. : 15/284513
DATED : April 4, 2017
INVENTOR(S) : Johnson It is certified that error appears in the above-identified patent and that said Letters Patent is hereby corrected as shown below:

In the Specification

Column 9, Line 22:
Delete "A" and insert --$\Lambda$--

Column 11, Line 45:
Delete "$\eta = \text{sinc}^2[m\pi(\lambda_B / 2-1)]$" and insert --$\eta = \text{sinc}^2[m\pi(\lambda_B / \lambda-1)]$--

Column 12, Line 60:
Delete "a period $\lambda$" and insert --a period $\Lambda$--

Signed and Sealed this
Thirtieth Day of May, 2017

Michelle K. Lee
*Director of the United States Patent and Trademark Office*